(12) United States Patent
Jiang et al.

(10) Patent No.: US 8,105,899 B2
(45) Date of Patent: *Jan. 31, 2012

(54) METHOD AND STRUCTURE FOR PERFORMING A CHEMICAL MECHANICAL POLISHING PROCESS

(75) Inventors: Lily Jiang, Shanghai (CN); Meng Feng Tsai, Shanghai (CN); Jian Guang Chang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 22 days.

This patent is subject to a terminal disclaimer.

(21) Appl. No.: 12/647,367

(22) Filed: Dec. 24, 2009

(65) Prior Publication Data

US 2010/0227465 A1    Sep. 9, 2010

(30) Foreign Application Priority Data

Dec. 29, 2008    (CN) .......................... 2008 1 0208186

(51) Int. Cl.
*H01L 21/336* (2006.01)
*H01L 21/3205* (2006.01)
*H01L 21/302* (2006.01)
*H01L 21/31* (2006.01)

(52) U.S. Cl. ......... 438/257; 438/587; 438/690; 438/783

(58) Field of Classification Search ........................ None
See application file for complete search history.

(56) References Cited

U.S. PATENT DOCUMENTS

| | | | | |
|---|---|---|---|---|
| 6,559,008 | B2 * | 5/2003 | Rabkin et al. | 438/257 |
| 7,273,775 | B1 * | 9/2007 | Ogawa | 438/201 |
| 7,541,240 | B2 * | 6/2009 | Pham et al. | 438/257 |
| 2005/0127473 | A1 * | 6/2005 | Sakagami | 257/510 |
| 2005/0199939 | A1 * | 9/2005 | Lutze et al. | 257/315 |
| 2006/0088987 | A1 * | 4/2006 | Yeo et al. | 438/488 |
| 2008/0277713 | A1 * | 11/2008 | Maekawa | 257/316 |
| 2010/0190329 | A1 | 7/2010 | Jiang et al. | |
| 2010/0227464 | A1 | 9/2010 | Jiang et al. | |
| 2010/0248468 | A1 | 9/2010 | Jiang et al. | |

OTHER PUBLICATIONS

Notice of Allowance for U.S. Appl. No. 12/647,362, mailed on Sep. 30, 2011, 5 pages.
Notice of Allowance for U.S. Appl. No. 12/647,359, mailed on Sep. 23, 2011, 5 pages.
Notice of Allowance for U.S. Appl. No. 12/647,369, mailed on Sep. 13, 2011, 5 pages.

* cited by examiner

*Primary Examiner* — Scott B Geyer
(74) *Attorney, Agent, or Firm* — Kilpatrick Townsend & Stockton LLP

(57) ABSTRACT

A method for fabricating flash memory devices, e.g., NAND, NOR, is provided. The method includes providing a semiconductor substrate. The method includes forming a second polysilicon layer overlying a plurality of floating gate structures to cause formation of an upper surface provided on the second polysilicon layer. The upper surface has a first recessed region and a second recessed region. The method includes depositing a dielectric material overlying the upper surface to fill the first recessed region and the second recessed region to form a second upper surface region and cover a first elevated region, a second elevated region, and a third elevated region. The method forms at least one dielectric spacer within the first recessed region and at least one dielectric spacer within the second recessed region to form a resulting surface region, and subjects the resulting surface region to a chemical mechanical polishing process to cause formation of a substantially planarized second polysilicon layer free from the dielectric material.

44 Claims, 16 Drawing Sheets

METHOD AND STRUCTURE FOR PERFORMING A CHEMICAL MECHANICAL POLISHING PROCESS

CROSS-REFERENCES FOR RELATED APPLICATIONS

This application claims priority to Chinese Application No. 200810208186.4; filed on Dec. 29, 2008; commonly assigned, and of which is hereby incorporated by reference for all purposes.

This application is also related to the following three U.S. patent applications, commonly assigned and being concurrently filed.
1. U.S. application Ser. No. 12/647,359 entitled "A METHOD AND STRUCTURE FOR PERFORMING A CHEMICAL MECHANICAL POLISHING PROCESS," by inventors Lily Jiang, Meng Feng Tsai, and Jian Guang Chang.
2. U.S. application Ser. No. 12/647,362 entitled "A METHOD AND STRUCTURE FOR PERFORMING A CHEMICAL MECHANICAL POLISHING PROCESS," by inventors Lily Jiang, Meng Feng Tsai, and Jian Guang Chang.
3. U.S. application Ser. No. 12/647,369 entitled "A METHOD AND STRUCTURE FOR PERFORMING A CHEMICAL MECHANICAL POLISHING PROCESS," by inventors Lily Jiang, Meng Feng Tsai, and Jian Guang Chang.

BACKGROUND OF THE INVENTION

The present invention is directed integrated circuits and their processing for the manufacture of semiconductor devices. More particularly, the invention provides a method and system for chemical mechanical polishing an upper polysilicon layer to form a stacked gate structure for flash memory integrated circuit devices, e.g., NAND, NOR. But it would be recognized that the invention has a much broader range of applicability. For example, the invention can be applied to a variety of other applications such as application specific integrated circuits, microprocessors, microcontrollers, other memory applications, and the like.

Over the past decades, integrated circuits have evolved from a handful of interconnected devices fabricated on a single chip of silicon to millions of devices. Performance and complexity are far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Certain semiconductor devices are now being fabricated with features less than a quarter of a micron across.

Increasing circuit density has not only improved the complexity and performance of circuits but also provided lower costs to consumers. Conventional semiconductor fabrication plants often costs hundreds of millions or even billions of U.S. dollars to construct. Each fabrication facility has a certain capacity measured in tens of thousands of wafer starts per month. Each wafer also has a certain number of potential chips. By manufacturing individual devices smaller and smaller, more devices are packed in a given area of semiconductor, which increases output of the fabrication facility. Making devices smaller is always very challenging, as each process for the manufacture of semiconductor devices has a limit. That is to say, a given process typically only works down to a certain feature size, and then either the process or the device layout should be changed.

Costs of operating fabrication facilities have also increased dramatically. As many know, many U.S. fabrication facilities that were operable in the 1970's and 1980's no longer exist. Many of such fabrication facilities migrated to Japan in the 1980's and then to Korea and Taiwan in the 1990's. As demand for lower cost fabrication facilities continues, China has now become a choice geographic location for fabrication facilities to start up. Many companies have already begun processing wafers through manufacturing facilities in China. Such companies include, but are not limited to, Semiconductor Manufacturing International Corporation, Taiwan Semiconductor Manufacturing Corporation of Taiwan, also called TSMC, and others. Although labor costs may be somewhat lower in China, there are still many costs that still need to be reduced or even eliminated as the demand for lower cost silicon continues.

From the above, it is seen that an improved technique for processing semiconductor devices is desired.

BRIEF SUMMARY OF THE INVENTION

According to the present invention, techniques for manufacturing semiconductor devices are provided. More particularly, the invention provides a method and system for chemical mechanical polishing an upper polysilicon layer to form a stacked gate structure for flash memory integrated circuit devices, e.g., NAND, NOR. But it would be recognized that the invention has a much broader range of applicability. For example, the invention can be applied to a variety of other applications such as application specific integrated circuits, microprocessors, microcontrollers, other memory applications, and the like.

In a specific embodiment, the present invention provides a method for fabricating flash memory devices, e.g., NAND, NOR. The method includes providing a semiconductor substrate, e.g., silicon wafer, silicon on insulator, epitaxial silicon, silicon germanium. The method forms a plurality of isolation regions on portions of the semiconductor substrate. The method forms a plurality of floating gate structures from at least a first polysilicon layer overlying the semiconductor substrate. In a specific embodiment, the plurality of floating gate structures includes a first floating gate structure, a second floating gate structure, and a third floating gate structure. In a preferred embodiment, the first floating gate structure is spaced from the second floating gate structure by at least a first isolation region. In a preferred embodiment, the second floating gate structure is spaced from the third floating gate structure by at least a second isolation region. The first isolation region and the second isolation region are from the plurality of isolation regions.

In a specific embodiment, the method forms a second polysilicon layer overlying the first floating gate structure, the second floating gate structure, and the third floating gate structure. The method causes formation of an upper surface provided on the second polysilicon layer. The upper surface has a first recessed region having a first depth within a first vicinity overlying the first isolation region and has a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure. The method includes depositing a photo resist material overlying the upper surface provided on the second polysilicon layer to fill the first recessed region and the second recessed region to form an upper surface region and to cover the first elevated region, the second elevated region, and the third elevated region.

In a preferred embodiment, the method subjects the upper surface region to a chemical mechanical polishing process to remove a first thickness of the photo resist material while maintaining a first portion of the photo resist material within the first recessed region and while maintaining a second portion of the photo resist material within the second recessed region to form an exposed region of the photo resist material while maintaining attachment of the second polysilicon layer to the first floating gate structure, second floating gate structure, and third floating gate structure. The method also includes subjecting the exposed region of the photo resist material to the chemical mechanical polishing process to remove the first elevated region, the second elevated region, and the third elevated region to cause formation of a substantially planarized second polysilicon layer free from the photo resist material.

In an alternative specific embodiment, the present invention provides a method for fabricating flash memory devices, e.g., NAND, NOR. The method includes providing a semiconductor substrate. The method also forms at least a first polysilicon layer including at least a first floating gate structure, a second floating gate structure, and a third floating gate structure, the first floating gate structure being spaced from the second floating gate structure by at least a first isolation region, the second floating gate structure being spaced from the third floating gate structure by at least a second isolation region.

In a specific embodiment, the method includes forming a second polysilicon layer overlying the first floating gate structure, the second floating gate structure, and the third floating gate structure to cause formation of an upper surface provided on the second polysilicon layer. In a specific embodiment, the upper surface has a first recessed region having a first depth within a first vicinity overlying the first isolation region and a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure. The method includes depositing a photo resist material overlying the upper surface provided on the second polysilicon layer to fill the first recessed region and the second recessed region to form an upper surface region and cover the first elevated region, the second elevated region, and the third elevated region. In a specific embodiment, the method subjects the upper surface region to a chemical mechanical polishing process to remove the first elevated region, the second elevated region, and the third elevated region to cause formation of a substantially planarized second polysilicon layer free from the photo resist material.

In a specific embodiment, the present invention provides a method for fabricating flash memory devices, e.g., NAND, NOR. The method includes providing a semiconductor substrate, e.g., silicon wafer, silicon on insulator, epitaxial silicon, silicon germanium. The method includes forming a plurality of isolation regions on portions of the semiconductor substrate. The method also forms a plurality of floating gate structures from at least a first polysilicon layer overlying the semiconductor substrate. The plurality of floating gate structures includes a first floating gate structure, a second floating gate structure, and a third floating gate structure. The first floating gate structure is spaced from the second floating gate structure by at least a first isolation region. The second floating gate structure is spaced from the third floating gate structure by at least a second isolation region. The first isolation region and the second isolation region are from the plurality of isolation regions.

In a specific embodiment, the method includes forming a second polysilicon layer overlying the first floating gate structure, the second floating gate structure, and the third floating gate structure. The method also causes formation of an upper surface provided on the second polysilicon layer. In a specific embodiment, the upper surface has a first recessed region having a first depth within a first vicinity overlying the first isolation region and has a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure.

In a specific embodiment, the method includes depositing a dielectric material overlying the upper surface provided on the second polysilicon layer to fill the first recessed region and the second recessed region to form an upper surface region and to cover the first elevated region, the second elevated region, and the third elevated region. The method includes subjecting the upper surface region to a chemical mechanical polishing process to remove a first thickness of the dielectric material while maintaining a first portion of the dielectric material within the first recessed region and while maintaining a second portion of the dielectric material within the second recessed region to form an exposed region of the dielectric material. The method also includes subjecting the exposed region of the dielectric material to the chemical mechanical polishing process to remove the first elevated region, the second elevated region, and the third elevated region to cause formation of a substantially planarized second polysilicon layer free from the dielectric material.

In a specific embodiment, the present invention includes a method for fabricating flash memory devices. The method includes providing a semiconductor substrate. The method also includes forming at least a first polysilicon layer including at least a first floating gate structure, a second floating gate structure, and a third floating gate structure. The first floating gate structure is spaced from the second floating gate structure by at least a first isolation region. The second floating gate structure is spaced from the third floating gate structure by at least a second isolation region.

In a specific embodiment, the method forms a second polysilicon layer overlying the first floating gate structure, the second floating gate structure, and the third floating gate structure to cause formation of an upper surface provided on the second polysilicon layer. In a specific embodiment, the upper surface has a first recessed region having a first depth within a first vicinity overlying the first isolation region and a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure.

In a specific embodiment, the method includes depositing a fill material overlying the upper surface provided on the second polysilicon layer to fill the first recessed region and the second recessed region to form an upper surface region and to cover the first elevated region, the second elevated region, and the third elevated region. The method includes subjecting the upper surface region to a chemical mechanical polishing process to remove the first elevated region, the second elevated region, and the third elevated region to cause formation of a substantially planarized second polysilicon layer free from the dielectric material.

In a specific embodiment, the present invention includes a method for fabricating flash memory devices, e.g., NAND, NOR. The method includes providing a semiconductor substrate, e.g., silicon wafer, silicon on insulator, epitaxial silicon, silicon germanium. The method includes forming a plurality of isolation regions on portions of the semiconductor substrate. The method also includes forming a plurality of floating gate structures from at least a first polysilicon layer overlying the semiconductor substrate. The plurality of floating gate structures includes a first floating gate structure, a second floating gate structure, and a third floating gate structure. The first floating gate structure is spaced from the second floating gate structure by at least a first isolation region. The second floating gate structure is spaced from the third floating gate structure by at least a second isolation region. In a specific embodiment, the first isolation region and the second isolation region are from the plurality of isolation regions.

In a specific embodiment, the method includes forming a second polysilicon layer overlying the first floating gate structure, the second floating gate structure, and the third floating gate structure. The method includes causing formation of an upper surface provided on the second polysilicon layer. The upper surface has a first recessed region having a first depth within a first vicinity overlying the first isolation region and has a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure.

In a specific embodiment, the present method includes depositing a dielectric material overlying the upper surface provided on the second polysilicon layer to fill the first recessed region and the second recessed region to form an upper surface region and to cover the first elevated region, the second elevated region, and the third elevated region. The method also includes removing, using at least an etching process, a thickness of the dielectric material to form at least one dielectric spacer within the first recessed region and to form at least one dielectric spacer within the second recessed region to form a resulting surface region. The method includes subjecting the resulting surface region to a chemical mechanical polishing process to cause formation of a substantially planarized second polysilicon layer free from the dielectric material.

In an alternative specific embodiment, the present invention provides a method for fabricating flash memory devices. The method includes providing a semiconductor substrate. The method includes forming at least a first polysilicon layer including at least a first floating gate structure, a second floating gate structure, and a third floating gate structure. The first floating gate structure is spaced from the second floating gate structure by at least a first isolation region. The second floating gate structure is spaced from the third floating gate structure by at least a second isolation region. The method includes forming a second polysilicon layer overlying the first floating gate structure, the second floating gate structure, and the third floating gate structure to cause formation of an upper surface provided on the second polysilicon layer. The upper surface has a first recessed region having a first depth within a first vicinity overlying the first isolation region and has a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure.

In a specific embodiment, the method also includes depositing a dielectric material overlying the upper surface provided on the second polysilicon layer to fill the first recessed region and the second recessed region to form an upper surface region and to cover the first elevated region, the second elevated region, and the third elevated region. In a specific embodiment, the method includes removing, using at least an etching process, a thickness of the dielectric material to form at least one dielectric spacer within the first recessed region and to form at least one dielectric spacer within the second recessed region to form a resulting surface region. The method also includes subjecting the resulting surface region to a chemical mechanical polishing process to remove the first elevated region, the second elevated region, and the third elevated region to cause formation of a substantially planarized second polysilicon layer free from the dielectric material.

In a specific embodiment, the present invention provides a method for fabricating flash memory devices. The method includes providing a semiconductor substrate. The method also includes forming a plurality of isolation regions on portions of the semiconductor substrate. The method includes forming a plurality of floating gate structures from at least a first polysilicon layer overlying the semiconductor substrate. In a specific embodiment, the plurality of floating gate structures includes a first floating gate structure, a second floating gate structure, and a third floating gate structure. The first floating gate structure is spaced from the second floating gate structure by at least a first isolation region. The second floating gate structure is spaced from the third floating gate structure by at least a second isolation region. The first isolation region and the second isolation region are from the plurality of isolation regions.

In a specific embodiment, the method includes forming a second polysilicon layer overlying the first floating gate structure, the second floating gate structure, and the third floating gate structure. The method also causes formation of an upper surface provided on the second polysilicon layer. The upper surface has a first recessed region having a first depth within a first vicinity overlying the first isolation region and a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure.

In a specific embodiment, the method includes depositing a conformal dielectric material overlying the upper surface provided on the second polysilicon layer to cover the first recessed region and the second recessed region and to cover the first elevated region, the second elevated region, and the third elevated region. The method also includes depositing a doped dielectric material overlying the conformal layer to fill the first recessed region and the second recessed region and to cover the first elevated region, the second elevated region, and the third elevated region to form a resulting surface region. The method includes subjecting the resulting surface region to a chemical mechanical polishing process to cause formation of a substantially planarized second polysilicon layer free from the doped dielectric material and the conformal dielectric material.

In an alternative specific embodiment, the present invention provides a method for fabricating flash memory devices. The method includes providing a semiconductor substrate. The method also includes forming at least a first polysilicon layer including at least a first floating gate structure, a second floating gate structure, and a third floating gate structure. The first floating gate structure is spaced from the second floating gate structure by at least a first isolation region. The second floating gate structure is spaced from the third floating gate structure by at least a second isolation region. The method also includes forming a second polysilicon layer overlying the first floating gate structure, the second floating gate structure, and the third floating gate structure to cause formation of an upper surface provided on the second polysilicon layer. In a specific embodiment, the upper surface has a first recessed region having a first depth within a first vicinity overlying the first isolation region and a second recessed region having a second depth within a second vicinity overlying the second isolation region. The first recessed region is between a first elevated region within a vicinity overlying the first floating gate structure and a second elevated region within a vicinity overlying the second floating gate structure. The second recessed region is between the second elevated region and a third elevated region within a vicinity overlying the third floating gate structure.

In a specific embodiment, the method includes depositing a conformal dielectric material overlying the upper surface provided on the second polysilicon layer to cover the first recessed region and the second recessed region and to cover the first elevated region, the second elevated region, and the third elevated region. The method also includes depositing a doped dielectric material overlying the conformal dielectric material provided on the second polysilicon layer to fill the first recessed region and the second recessed region and to cover the first elevated region, the second elevated region, and the third elevated region to form an upper surface region. In a specific embodiment, the method includes subjecting the upper surface region to a chemical mechanical polishing process to remove the first elevated region, the second elevated region, and the third elevated region to cause formation of a substantially planarized second polysilicon layer free from the doped dielectric material and the conformal dielectric material.

Many benefits are achieved by way of the present invention over conventional techniques. For example, the present technique provides an easy way to use process that relies upon conventional technology. In some embodiments, the method provides higher device yields in dies per wafer. Additionally, the method provides a process that is compatible with conventional process technology without substantial modifications to conventional equipment and processes. In other aspects of the invention, the present methods provide for a method of polishing polysilicon provided for multi-layered gate structures. In a specific embodiment, the present method provides a way of planarizing a second polysilicon layer, which remains attached to an underlying layer and does not delaminate. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for manufacturing semiconductor devices are provided. More particularly, the invention provides a method and system for chemical mechanical polishing an upper polysilicon layer to form a stacked gate structure for flash memory integrated circuit devices, e.g., NAND, NOR. But it would be recognized that the invention has a much broader range of applicability. For example, the invention can be applied to a variety of other applications such as application specific integrated circuits, microprocessors, microcontrollers, other memory applications, and the like. Before describing specific details of the present method and device, we have provided an explanation of limitations uncovered in conventional methods and device structures.

Figure 1:
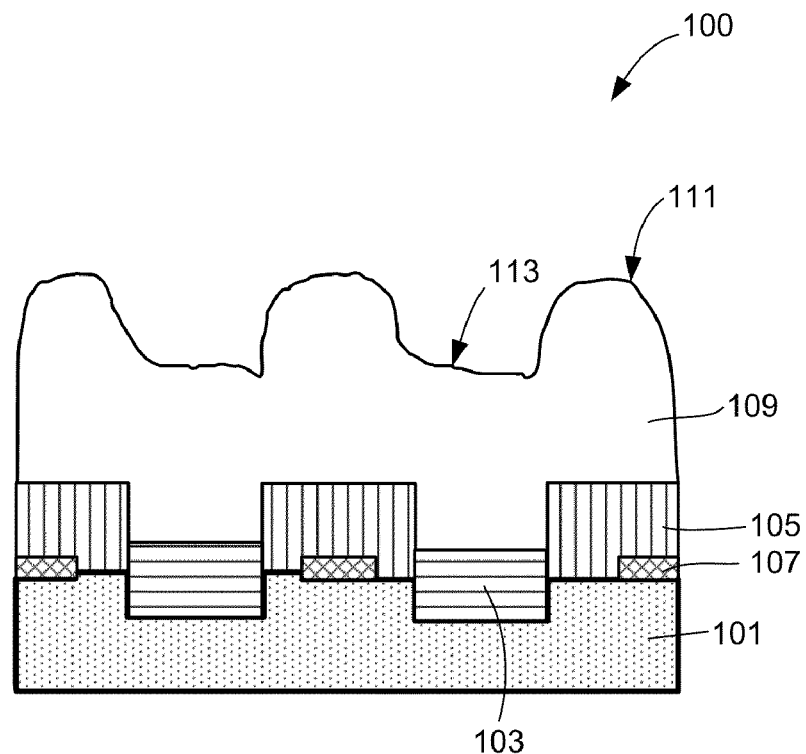
FIGS. 1, 2, 3A, 3B, 3C, and 3D illustrate a conventional method of forming a multi-layered gate structure.
Figure 2:
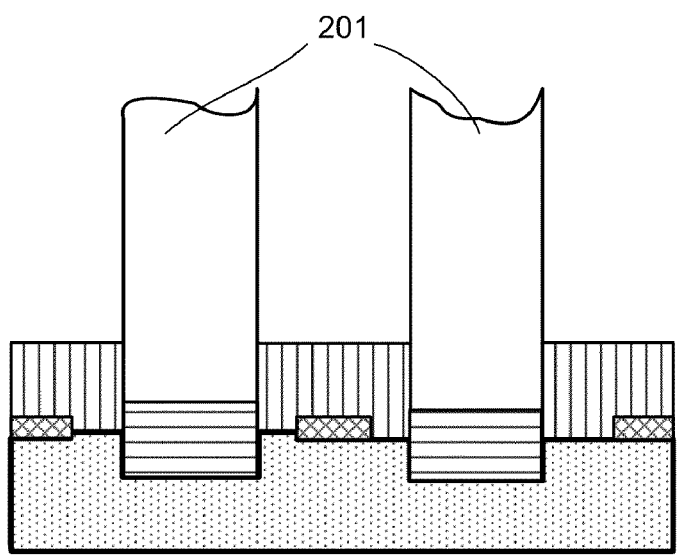
Figure 3A:
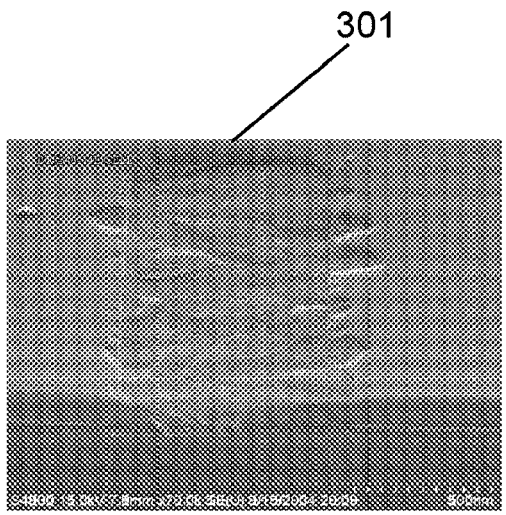
Figure 3B:
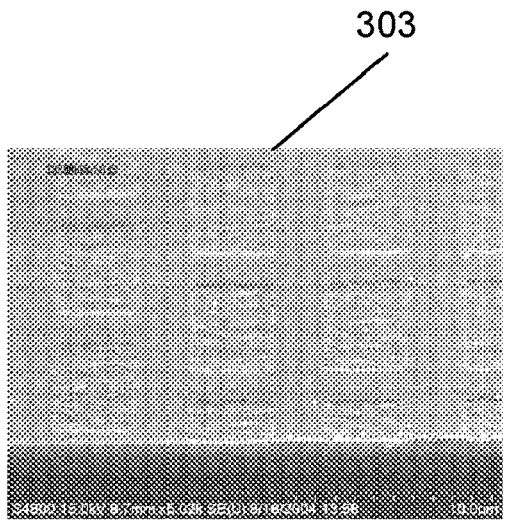
Figure 3C:
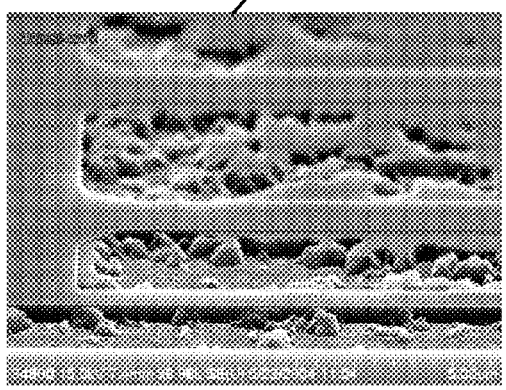
Figure 3D:
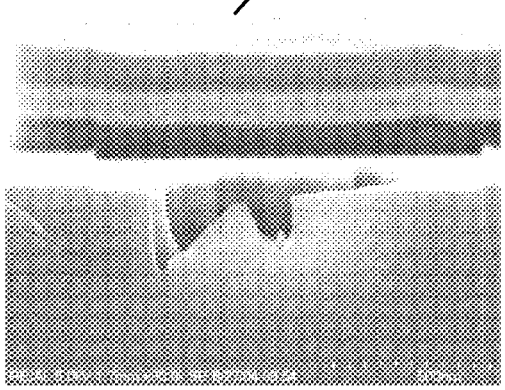

FIGS. 1, 2, 3A, 3B, 3C, and 3D illustrate a conventional method of forming a multi-layered gate structure 100. As shown, the conventional method includes providing a silicon substrate 101, which includes a plurality of isolation regions 103. The gate structure includes a gate dielectric layer 107, which is underlying a stacked gate structure 105. The stacked gate structure includes an overlying polysilicon 109 fill material, which is formed with an uneven surface 111 and 113. In a specific embodiment, the uneven surface includes recessed regions surrounded by elevated regions. Referring to FIG. 2, the uneven surface is subjected to a polishing process, which forms broken regions 201. To further illustrate the broken regions, at least part of a peripheral active area polysilicon has been detached during gate polysilicon-2-CMP due to low gate density in the peripheral area. Such broken regions are exemplified in 301 and 303 (enlarged version) in respective FIG. 3A and FIG. 3B. As also shown, floating gate as defined by gate polysilicon-2 is partially or completely removed when only the gate polysilicon-2 is subjected to the polishing process. Due to the fragility of gate polysilicon-2, even a ultra down force (for example, 10 pounds per square inch) and a low table speed (for example 30 revolution per minute) did not alleviate the problem. As further shown, region 305 (FIG. 3C) illustrates partially broken gate polysilicon-2, which is enlarged in the illustration 307 (FIG. 3D). As will be seen below, the present method and structure provide a way of improving the stacked gate structure according to embodiments of the present invention. Further details of the present method and structure can be found throughout the present specification and more particularly below.

Method I

In a specific embodiment, the present invention provides a method for fabricating flash memory devices, e.g., NAND, NOR, which is outlined below.

1. Provide a semiconductor substrate, e.g., silicon wafer, silicon on insulator, epitaxial silicon, silicon germanium;

2. Form a plurality of isolation regions on portions of the semiconductor substrate;

3. Form a plurality of floating gate structures (including a first floating gate structure, a second floating gate structure, and a third floating gate structure) from at least a first polysilicon layer overlying the semiconductor substrate;

4. Form an oxide-on-nitride-on-oxide layer overlying the floating gate structures;

5. Form a second polysilicon layer overlying the first floating gate structure, the second floating gate structure, and the third floating gate structure;

6. Cause formation of an upper surface provided on the second polysilicon layer (where the upper surface has a first recessed region having a first depth within a first vicinity overlying the first isolation region and has a second recessed region having a second depth within a second vicinity overlying the second isolation region);

7. Deposit a photo resist material overlying the upper surface provided on the second polysilicon layer to fill the first recessed region and the second recessed region to form an upper surface region and to cover a first elevated region, a second elevated region, and a third elevated region (where the first recessed region is between the first elevated region and the second elevated region and the second recessed region is between the second elevated region and the third elevated region);

8. Subject the upper surface region to a chemical mechanical polishing process to remove a first thickness of the photo resist material while maintaining a first portion of the photo resist material within the first recessed region and while maintaining a second portion of the photo resist material within the second recessed region to form an exposed region of the photo resist material while maintaining attachment of the second polysilicon layer to the first floating gate structure, second floating gate structure, and third floating gate structure;

9. Subject the exposed region of the photo resist material to the chemical mechanical polishing process to remove the first elevated region, the second elevated region, and the third elevated region to cause formation of a substantially planarized second polysilicon layer free from the photo resist material; and 10. Form a dielectric material overlying the second polysilicon layer; and 11. Perform other steps, as desired.

As shown, the above sequence of steps provides a method according to an embodiment of the present invention. As shown, the method uses a combination of steps including a way of forming a multi-layered gate structure for a Flash Memory Device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 4:
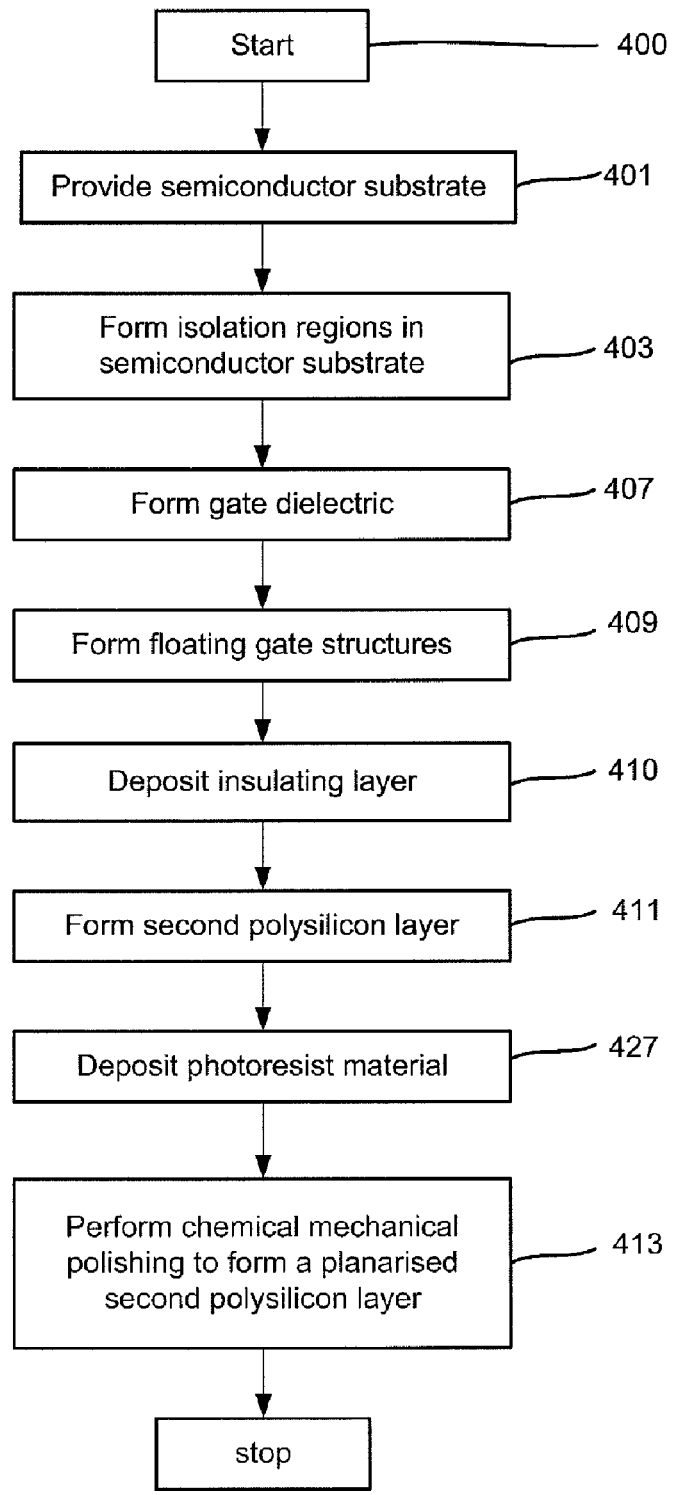
FIG. 4 is a simplified flow diagram illustrating a first method of forming a multi-layered gate structure according to an embodiment of the present invention.

FIG. 4 is a simplified flow diagram illustrating a first method of forming a multi-layered gate structure according to an embodiment of the present invention. This diagram is merely an example, which should not unduly limit the scope of the claims herein. One of ordinary skill in the art would recognize many variations, modifications, and alternatives.

Figure 5:
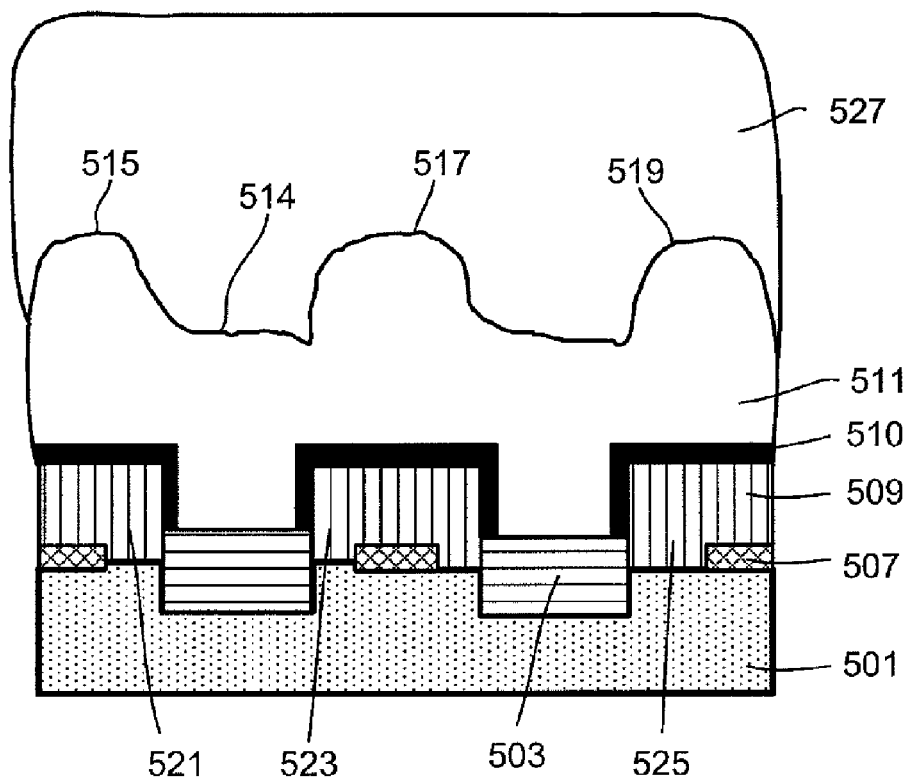
FIGS. 5 and 6 are simplified side view diagrams illustrating a first method of forming a multi-layered gate structure according to an embodiment of the present invention.
Figure 6:
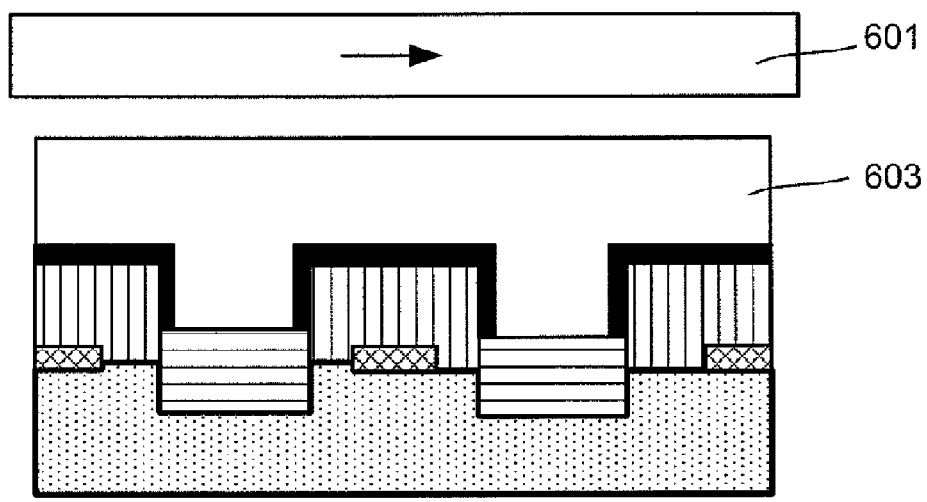

In a specific embodiment, the present invention provides a method for fabricating flash memory devices, e.g., NAND, NOR. As shown in FIGS. 4 and 5, the method begins with start, step 400. In a specific embodiment, the method includes providing a semiconductor substrate 501, 401, e.g., silicon wafer, silicon on insulator, epitaxial silicon, silicon germanium. In a specific embodiment, the method forms a plurality of isolation regions 403, 503 on portions of the semiconductor substrate. The isolation regions can be formed using a shallow trench isolation process, commonly called STI or the like. As also shown, FIGS. 5 and 6 are simplified side view diagrams illustrating a first method of forming a multi-layered gate structure according to an embodiment of the present invention. These diagrams are merely examples, which should not unduly limit the scope of the claims herein. One of ordinary skill in the art would recognize many variations, modifications, and alternatives.

In a specific embodiment, the method forms a gate dielectric layer 407, 507 overlying the semiconductor substrate. The gate dielectric layer can be made of a silicon dioxide, silicon nitride, silicon oxynitride, or any combination of these materials. In a specific embodiment, the gate dielectric layer is high quality and substantially free from any imperfections, e.g., pin holes. Of course, there can be other variations, modifications, and alternatives.

Referring again to FIGS. 4 and 5, the method forms a plurality of floating gate structures 409, 509 from at least a first polysilicon layer overlying the semiconductor substrate. In a specific embodiment, the plurality of floating gate structures includes a first floating gate structure 521, a second floating gate structure 523, and a third floating gate structure 525. In a preferred embodiment, the first floating gate structure is spaced from the second floating gate structure by at least a first isolation region. In a preferred embodiment, the second floating gate structure is spaced from the third floating gate structure by at least a second isolation region. The first isolation region and the second isolation region are from the plurality of isolation regions.

In a specific embodiment, the method forms an insulation layer 410, 510 overlying the floating gate structures. In a specific embodiment, the isolating layer can be an oxide-on-nitride-on-oxide layer, commonly called "ONO" layers. The oxide is silicon dioxide or other like material. The nitride is often silicon nitride or silicon oxynitride or other like material. Of course, there can be other variations, modifications, and alternatives.

In a specific embodiment, the method forms a second polysilicon layer 411, 511 overlying the first floating gate structure, the second floating gate structure, and the third floating gate structure. The method causes formation of an upper surface 514 provided on the second polysilicon layer. The upper surface has a first recessed region having a first depth within a first vicinity overlying the first isolation region and has a second recessed region having a second depth within a second vicinity overlying the second isolation region. The first recessed region is between a first elevated region 515 within a vicinity overlying the first floating gate structure and a second elevated region 517 within a vicinity overlying the second floating gate structure. The second recessed region is between the second elevated region and a third elevated region 519 within a vicinity overlying the third floating gate structure.

In a specific embodiment, the method includes depositing a photo resist material 427, 527 overlying the upper surface provided on the second polysilicon layer to fill the first recessed region and the second recessed region to form an upper surface region and to cover the first elevated region, the second elevated region, and the third elevated region, as shown. In a specific embodiment, the photo resist material can be replaced by any suitable fill material, including combinations of materials without departing from the scope of the claims herein. One of ordinary skill in the art would recognize many variations, modifications, and alternatives.

In a preferred embodiment, the method subjects the upper surface region to a chemical mechanical polishing process 413, 601 to remove a first thickness of the photo resist material while maintaining a first portion of the photo resist material within the first recessed region and while maintaining a second portion of the photo resist material within the second recessed region to form an exposed region of the photo resist material while maintaining attachment of the second polysilicon layer to the first floating gate structure, second floating gate structure, and third floating gate structure. The method also includes subjecting the exposed region of the photo resist material to the chemical mechanical polishing process to remove the first elevated region, the second elevated region, and the third elevated region to cause formation of a substantially planarized second polysilicon layer 603 free from the photo resist material. In a specific embodiment, the method forms a dielectric layer or layers overlying the second polysilicon layer. Of course, there can be other variations, modifications, and alternatives.

As shown, the above sequence of steps provides a method according to an embodiment of the present invention. As shown, the method uses a combination of steps including a way of forming a multi-layered gate structure for a Flash Memory Device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Method II

In a alternative embodiment, the present invention provides a method for fabricating flash memory devices, e.g., NAND, NOR, which is outlined below.

1. Provide a semiconductor substrate, e.g., silicon wafer, silicon on insulator, epitaxial silicon, silicon germanium;

2. Form a plurality of isolation regions on portions of the semiconductor substrate;

3. Form a plurality of floating gate structures (including a first floating gate structure, a second floating gate structure, and a third floating gate structure) from at least a first polysilicon layer overlying the semiconductor substrate;

4. Form an oxide-on-nitride-on-oxide layer overlying the floating gate structures;

5. Form a second polysilicon layer overlying the first floating gate structure, the second floating gate structure, and the third floating gate structure;

6. Cause formation of an upper surface provided on the second polysilicon layer (where the upper surface has a first recessed region having a first depth within a first vicinity overlying the first isolation region and has a second recessed region having a second depth within a second vicinity overlying the second isolation region);

7. Deposit a dielectric material overlying the upper surface provided on the second polysilicon layer to fill the first recessed region and the second recessed region to form an upper surface region and to cover a first elevated region, a second elevated region, and a third elevated region (where the first recessed region is between the first elevated region and the second elevated region and the second recessed region is between the second elevated region and the third elevated region);

8. Subject the upper surface region to a chemical mechanical polishing process to remove a first thickness of the dielectric material while maintaining a first portion of the dielectric material within the first recessed region and while maintaining a second portion of the dielectric material within the second recessed region to form an exposed region of the photo resist material while maintaining attachment of the second polysilicon layer to the first floating gate structure, second floating gate structure, and third floating gate structure;

9. Subject the exposed region of the dielectric material to the chemical mechanical polishing process to remove the first elevated region, the second elevated region, and the third elevated region to cause formation of a substantially planarized second polysilicon layer free from the dielectric material; and 10. Form a dielectric layer overlying the second polysilicon layer; and 11. Perform other steps, as desired.

Figure 7:
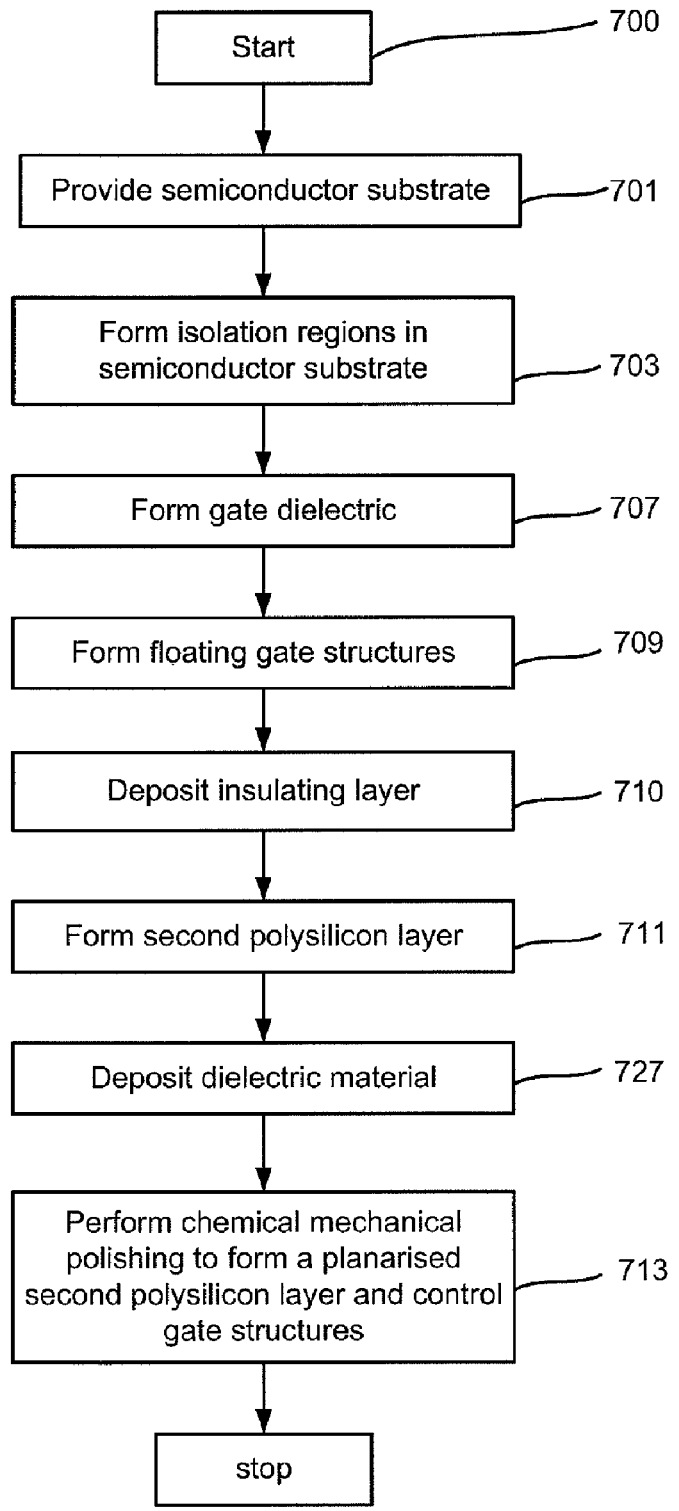
FIG. 7 is a simplified flow diagram illustrating a second method of forming a multi-layered gate structure according to an embodiment of the present invention.

FIG. 7 is a simplified flow diagram illustrating a second method of forming a multi-layered gate structure according to an embodiment of the present invention. This diagram is merely an example, which should not unduly limit the scope of the claims herein. One of ordinary skill in the art would recognize many variations, modifications, and alternatives.

Figure 8:
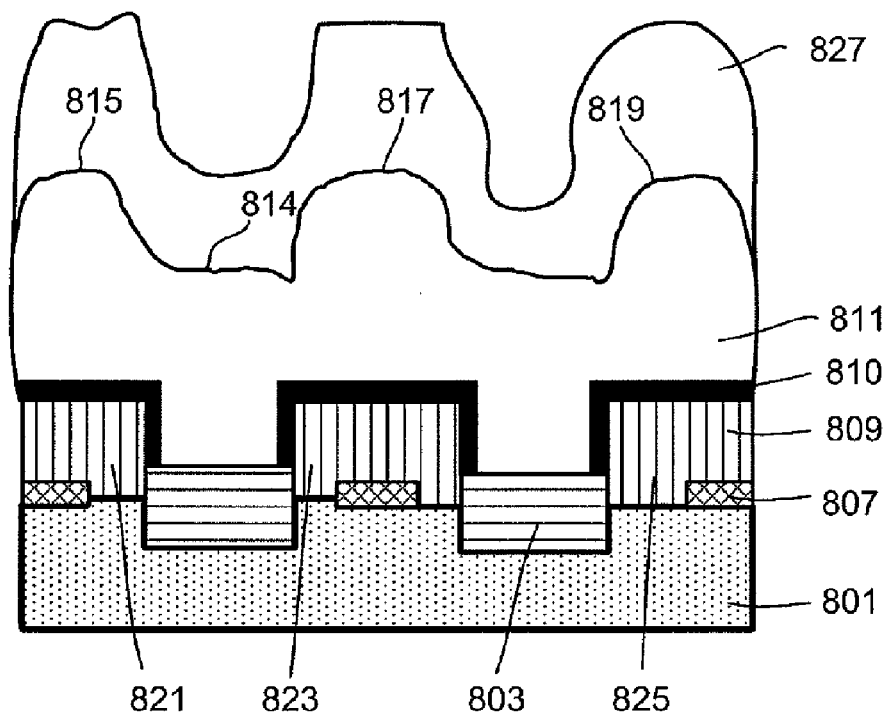
FIGS. 8 and 9 are simplified side view diagrams illustrating a second method of forming a multi-layered gate structure according to an embodiment of the present invention.
Figure 9:
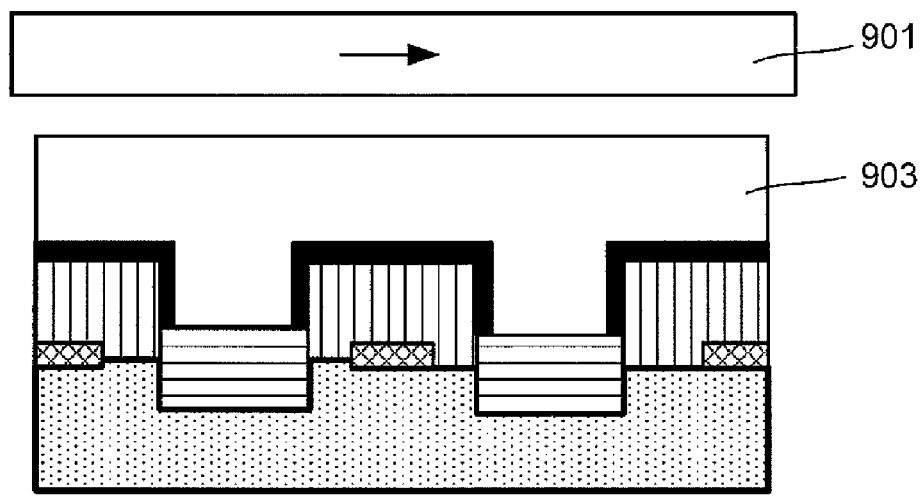

FIGS. 8 and 9 are simplified side view diagrams illustrating a second method of forming a multi-layered gate structure according to an embodiment of the present invention. These diagrams are merely examples, which should not unduly limit the scope of the claims herein. One of ordinary skill in the art would recognize many variations, modifications, and alternatives.

In a specific embodiment, the present invention provides a method for fabricating flash memory devices, e.g., NAND, NOR. As shown in FIGS. 7 and 8, the method begins with start, step 700. In a specific embodiment, the method includes providing a semiconductor substrate 701, 801, e.g., silicon wafer, silicon on insulator, epitaxial silicon, silicon germanium. In a specific embodiment, the method forms a plurality of isolation regions 703, 803 on portions of the semiconductor substrate. The isolation regions can be formed using a shallow trench isolation process, commonly called STI or the like. As also shown, FIGS. 8 and 9 are simplified side view diagrams illustrating a second method of forming a multi-layered gate structure according to an embodiment of the present invention. These diagrams are merely examples, which should not unduly limit the scope of the claims herein. One of ordinary skill in the art would recognize many variations, modifications, and alternatives.

In a specific embodiment, the method forms a gate dielectric layer 707, 807 overlying the semiconductor substrate. The gate dielectric layer can be made of a silicon dioxide, silicon nitride, silicon oxynitride, or any combination of these materials. In a specific embodiment, the gate dielectric layer is high quality and substantially free from any imperfections, e.g., pin holes. Of course, there can be other variations, modifications, and alternatives.

Referring again to FIGS. 7 and 8, the method forms a plurality of floating gate structures 709, 809 from at least a first polysilicon layer overlying the semiconductor substrate. In a specific embodiment, the plurality of floating gate structures includes a first floating gate structure 821, a second floating gate structure 823, and a third floating gate structure 825. In a preferred embodiment, the first floating gate structure is spaced from the second floating gate structure by at least a first isolation region. In a preferred embodiment, the second floating gate structure is spaced from the third floating gate structure by at least a second isolation region. The first isolation region and the second isolation region are from the plurality of isolation regions.

In a specific embodiment, the method forms an insulating layer 810 overlying the floating gate structures. In a specific embodiment, the isolating layer can be an oxide-on-nitride-on-oxide layer, commonly called "ONO" layers. The oxide is silicon dioxide or other like material. The nitride is often silicon nitride or silicon oxynitride or other like material. Of course, there can be other variations, modifications, and alternatives.

In a specific embodiment, the method forms a second polysilicon layer 711, 811 overlying the first floating gate structure, the second floating gate structure, and the third floating gate structure. The method causes formation of an upper surface 814 provided on the second polysilicon layer. The upper surface has a first recessed region having a first depth within a first vicinity overlying the first isolation region and has a second recessed region having a second depth within a second vicinity overlying the second isolation region. The first recessed region is between a first elevated region 815 within a vicinity overlying the first floating gate structure and a second elevated region 817 within a vicinity overlying the second floating gate structure. The second recessed region is between the second elevated region and a third elevated region 819 within a vicinity overlying the third floating gate structure.

In a specific embodiment, the method includes depositing a dielectric material 827 overlying the upper surface provided on the second polysilicon layer to fill the first recessed region and the second recessed region to form an upper surface region and to cover the first elevated region, the second elevated region, and the third elevated region, as shown. An example of such dielectric material may be tetraethyloxysilicate deposited using a plasma process. Other like materials may also be used depending on the application. In a specific embodiment, the dielectric material can be replaced by any suitable fill material, including combinations of materials without departing from the scope of the claims herein. One of ordinary skill in the art would recognize many variations, modifications, and alternatives.

In a preferred embodiment, the method subjects the upper surface region to a chemical mechanical polishing process 713, 901 to remove a first thickness of the dielectric material while maintaining a first portion of the dielectric material within the first recessed region and while maintaining a second portion of the dielectric material within the second recessed region to form an exposed region of the dielectric material while maintaining attachment of the second polysilicon layer to the first floating gate structure, second floating gate structure, and third floating gate structure. The method also includes subjecting the exposed region of the dielectric material to the chemical mechanical polishing process to remove the first elevated region, the second elevated region, and the third elevated region to cause formation of a substantially planarized second polysilicon layer 903 free from the dielectric material. In a specific embodiment, the method forms a dielectric layer or layers overlying the second polysilicon layer. Of course, there can be other variations, modifications, and alternatives.

As shown, the above sequence of steps provides a method according to an embodiment of the present invention. As shown, the method uses a combination of steps including a way of forming a multi-layered gate structure for a Flash Memory Device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Method III

In a alternative specific embodiment, the present invention provides a method for fabricating flash memory devices, e.g., NAND, NOR, which is outlined below.

1. Provide a semiconductor substrate, e.g., silicon wafer, silicon on insulator, epitaxial silicon, silicon germanium;

2. Form a plurality of isolation regions on portions of the semiconductor substrate;

3. Form a plurality of floating gate structures (including a first floating gate structure, a second floating gate structure, and a third floating gate structure) from at least a first polysilicon layer overlying the semiconductor substrate;

4. Form an oxide-on-nitride-on-oxide layer overlying the floating gate structures;

5. Form a second polysilicon layer overlying the first floating gate structure, the second floating gate structure, and the third floating gate structure;

6. Cause formation of an upper surface provided on the second polysilicon layer (where the upper surface has a first recessed region having a first depth within a first vicinity overlying the first isolation region and has a second recessed region having a second depth within a second vicinity overlying the second isolation region);

7. Deposit a dielectric material overlying the upper surface provided on the second polysilicon layer to fill the first recessed region and the second recessed region to form an upper surface region and to cover a first elevated region, a second elevated region, and a third elevated region (where the first recessed region is between the first elevated region and the second elevated region and the second recessed region is between the second elevated region and the third elevated region);

8. Subject the upper surface region to at least an etch process to form at least one dielectric spacer structure in the first recessed region and at least one dielectric spacer structure in the second recessed region to form a resulting surface region;

9. Subject the resulting surface region to a chemical mechanical polishing process to remove the first elevated region, the second elevated region, and the third elevated region to cause formation of a substantially planarized second polysilicon layer free from the photo resist material; and 10. Form a dielectric layer overlying the second polysilicon layer; and 11. Perform other steps, as desired.

As shown, the above sequence of steps provides a method according to an embodiment of the present invention. As shown, the method uses a combination of steps including a way of forming a multi-layered gate structure for a Flash Memory Device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 10:
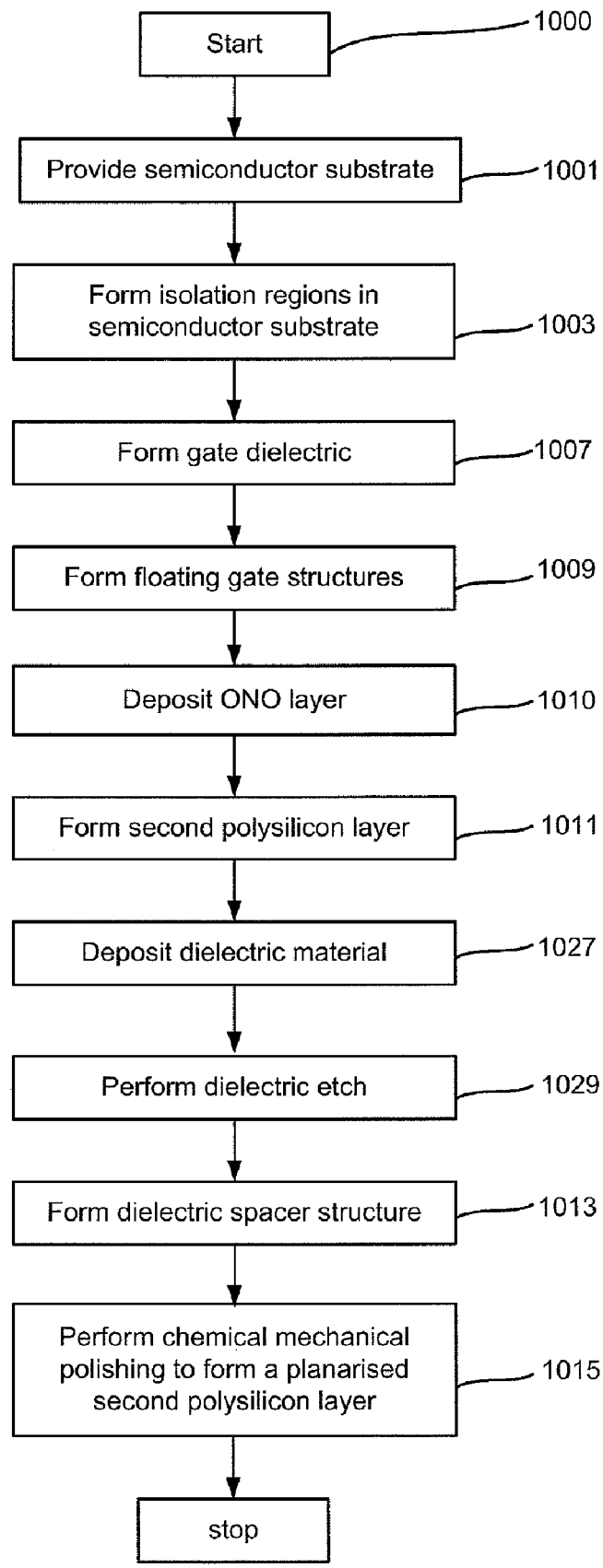
FIG. 10 is a simplified flow diagram illustrating a third method of forming a multi-layered gate structure according to an embodiment of the present invention.

FIG. 10 is a simplified flow diagram illustrating a third method of forming a multi-layered gate structure according to an embodiment of the present invention. This diagram is merely an example, which should not unduly limit the scope of the claims herein. One of ordinary skill in the art would recognize many variations, modifications, and alternatives.

Figure 11:
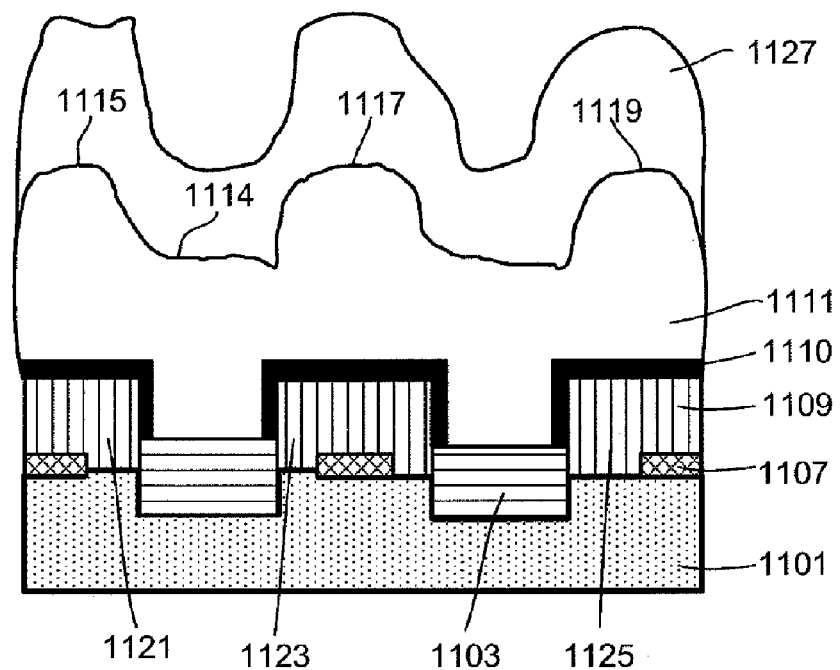
FIGS. 11 to 13 are simplified side view diagrams illustrating a third method of forming a multi-layered gate structure according to an embodiment of the present invention.
Figure 12:
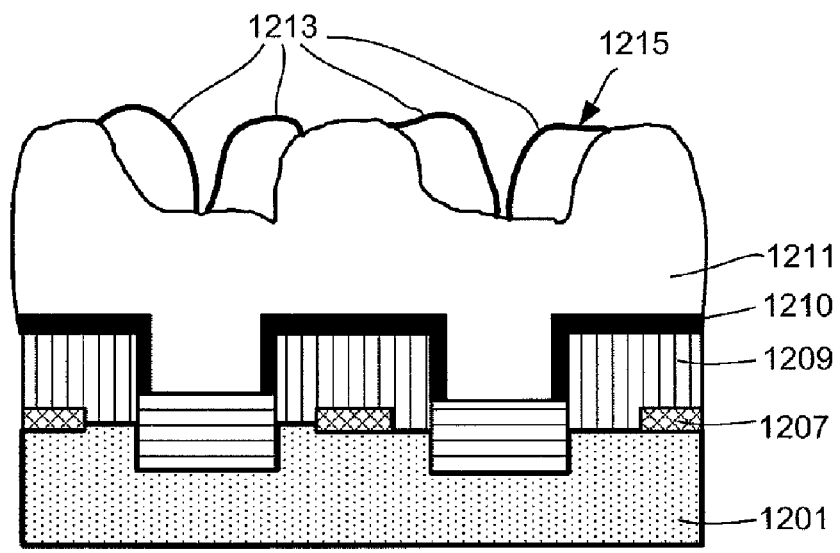
Figure 13:
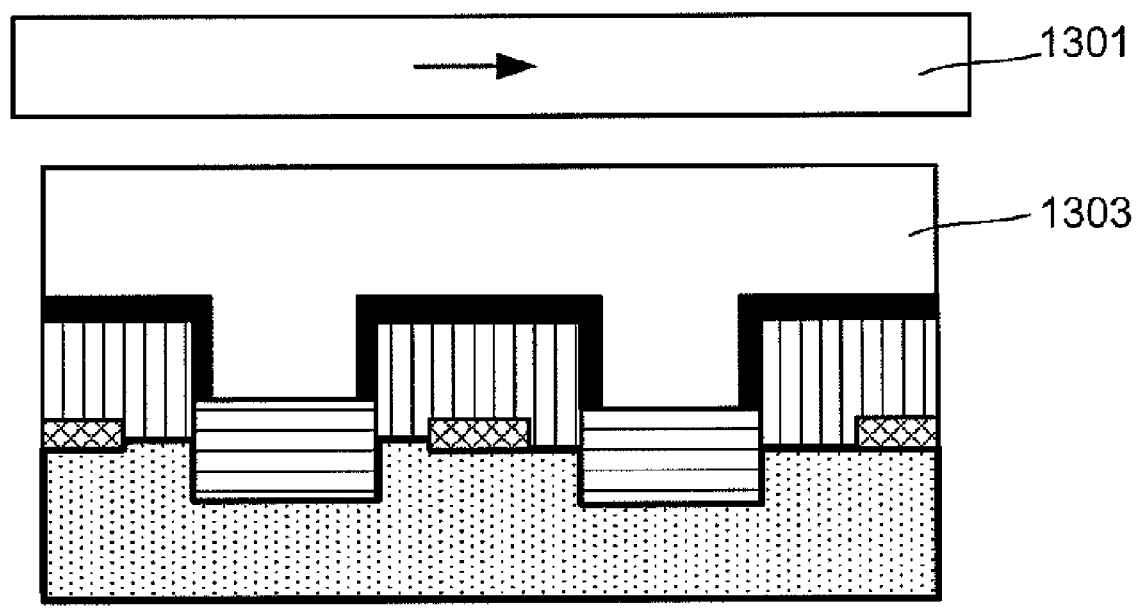

FIGS. 11 to 13 are simplified side view diagrams illustrating a third method of forming a multi-layered gate structure according to an embodiment of the present invention. These diagrams are merely examples, which should not unduly limit the scope of the claims herein. One of ordinary skill in the art would recognize many variations, modifications, and alternatives.

In a specific embodiment, the present invention provides a method for fabricating flash memory devices, e.g., NAND, NOR. As shown, the method begins with start, step 1000. In a specific embodiment, the method includes providing a semiconductor substrate 1001,1101, e.g., silicon wafer, silicon on insulator, epitaxial silicon, silicon germanium. In a specific embodiment, the method forms a plurality of isolation regions 1103 on portions of the semiconductor substrate. The isolation regions can be formed using a shallow trench isolation process, commonly called STI or the like. As also shown, FIGS. 11 and 12 are simplified side view diagrams illustrating a third method of forming a multi-layered gate structure according to an embodiment of the present invention. These diagrams are merely examples, which should not unduly limit the scope of the claims herein. One of ordinary skill in the art would recognize many variations, modifications, and alternatives.

In a specific embodiment, the method forms a gate dielectric layer 1107, 1207 overlying the semiconductor substrate. The gate dielectric layer can be made of a silicon dioxide, silicon nitride, silicon oxynitride, or any combination of these materials. In a specific embodiment, the gate dielectric layer is high quality and substantially free from any imperfections, e.g., pin holes. Of course, there can be other variations, modifications, and alternatives.

Referring again to FIGS. 11 and 12, the method forms a plurality of floating gate structures 1109, 1209 from at least a first polysilicon layer overlying the semiconductor substrate. In a specific embodiment, the plurality of floating gate structures includes a first floating gate structure 1121, a second floating gate structure 1123, and a third floating gate structure 1125. In a preferred embodiment, the first floating gate structure is spaced from the second floating gate structure by at least a first isolation region. In a preferred embodiment, the second floating gate structure is spaced from the third floating gate structure by at least a second isolation region. The first isolation region and the second isolation region are from the plurality of isolation regions.

In a specific embodiment, the method forms an isolating layer 1110 overlying the floating gate structures. In a specific embodiment, the isolating layer can be an oxide-on-nitride-on-oxide layer, commonly called "ONO" layers. The oxide is silicon dioxide or other like material. The nitride is often silicon nitride or silicon oxynitride or other like material. Of course, there can be other variations, modifications, and alternatives.

In a specific embodiment, the method forms a second polysilicon layer 1011, 1111 overlying the first floating gate structure, the second floating gate structure, and the third floating gate structure. The method causes formation of an upper surface 1114 provided on the second polysilicon layer. The upper surface has a first recessed region having a first depth within a first vicinity overlying the first isolation region and has a second recessed region having a second depth within a second vicinity overlying the second isolation region. The first recessed region is between a first elevated region 1115 within a vicinity overlying the first floating gate structure and a second elevated region 1117 within a vicinity overlying the second floating gate structure. The second recessed region is between the second elevated region and a third elevated region 1119 within a vicinity overlying the third floating gate structure.

In a specific embodiment, the method includes depositing a dielectric material 1127 overlying the upper surface provided on the second polysilicon layer to fill the first recessed region and the second recessed region to form an upper surface region and to cover the first elevated region, the second elevated region, and the third elevated region, as shown. An example of such dielectric material may be tetraethyloxysilicate deposited using a plasma process. Other like materials may also be used depending on the application. In a specific embodiment, the dielectric material can be replaced by any suitable fill material, including combinations of materials without departing from the scope of the claims herein. One of ordinary skill in the art would recognize many variations, modifications, and alternatives. In a specific embodiment, the method includes removing a thickness of the dielectric material using an etching process 1029 to form dielectric spacer structures 1013, 1213 in the first recessed region and the second recessed region, exposing a portion of the upper surface, and to form a resulting surface region 1215 as shown in FIGS. 10 and 12.

In a preferred embodiment, the method subjects the resulting surface region including the dielectric spacer structure and the exposed portion of the upper surface to a chemical mechanical polishing process 1015, 1301 while maintaining attachment of the second polysilicon layer to the first floating gate structure, second floating gate structure, and third floating gate structure. The method also includes subjecting the exposed region of the second polysilicon material to the chemical mechanical polishing process to remove the first elevated region, the second elevated region, and the third elevated region to cause formation of a substantially planarized second polysilicon layer 1303 free from the dielectric material. In a specific embodiment, the method forms a dielectric layer or layers overlying the second polysilicon layer. Of course, there can be other variations, modifications, and alternatives.

As shown, the above sequence of steps provides a method according to an embodiment of the present invention. As shown, the method uses a combination of steps including a way of forming a multi-layered gate structure for a Flash Memory Device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Method IV

In a yet an alternate specific embodiment, the present invention provides a method for fabricating flash memory devices, e.g., NAND, NOR, which is outlined below.

1. Provide a semiconductor substrate, e.g., silicon wafer, silicon on insulator, epitaxial silicon, silicon germanium;

2. Form a plurality of isolation regions on portions of the semiconductor substrate;

3. Form a plurality of floating gate structures (including a first floating gate structure, a second floating gate structure, and a third floating gate structure) from at least a first polysilicon layer overlying the semiconductor substrate;

4. Form an oxide-on-nitride-on-oxide layer overlying the floating gate structures;

5. Form a second polysilicon layer overlying the first floating gate structure, the second floating gate structure, and the third floating gate structure;

6. Cause formation of an upper surface provided on the second polysilicon layer (where the upper surface has a first recessed region having a first depth within a first vicinity overlying the first isolation region and has a second recessed region having a second depth within a second vicinity overlying the second isolation region);

7. Deposit a conforming dielectric material overlying the upper surface provided on the second polysilicon layer.

8. Depositing a doped dielectric material to fill the first recessed region and the second recessed region to form an upper surface region and to cover a first elevated region, a second elevated region, and a third elevated region (where the first recessed region is between the first elevated region and the second elevated region and the second recessed region is between the second elevated region and the third elevated region);

8. Subject the upper surface region to a chemical mechanical polishing process to remove a first thickness of the doped dielectric while maintaining a first portion of the doped dielectric material within the first recessed region and while maintaining a second portion of the doped dielectric material in the second recessed region to form an exposed region of the doped dielectric material while maintaining attachment of the second polysilicon layer to the first floating gate structure, the second floating gate structure, and the third floating gate structure;

9. Subject the exposed region of the doped dielectric material to a chemical mechanical polishing process to remove the first elevated region, the second elevated region, and the third elevated region to cause formation of a substantially planarized second polysilicon layer free from the doped dielectric material and the conforming dielectric material; and 10. Form a dielectric layer overlying the second polysilicon layer; and 11. Perform other steps, as desired.

As shown, the above sequence of steps provides a method according to an embodiment of the present invention. As shown, the method uses a combination of steps including a way of forming a multi-layered gate structure for a Flash Memory Device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 14:
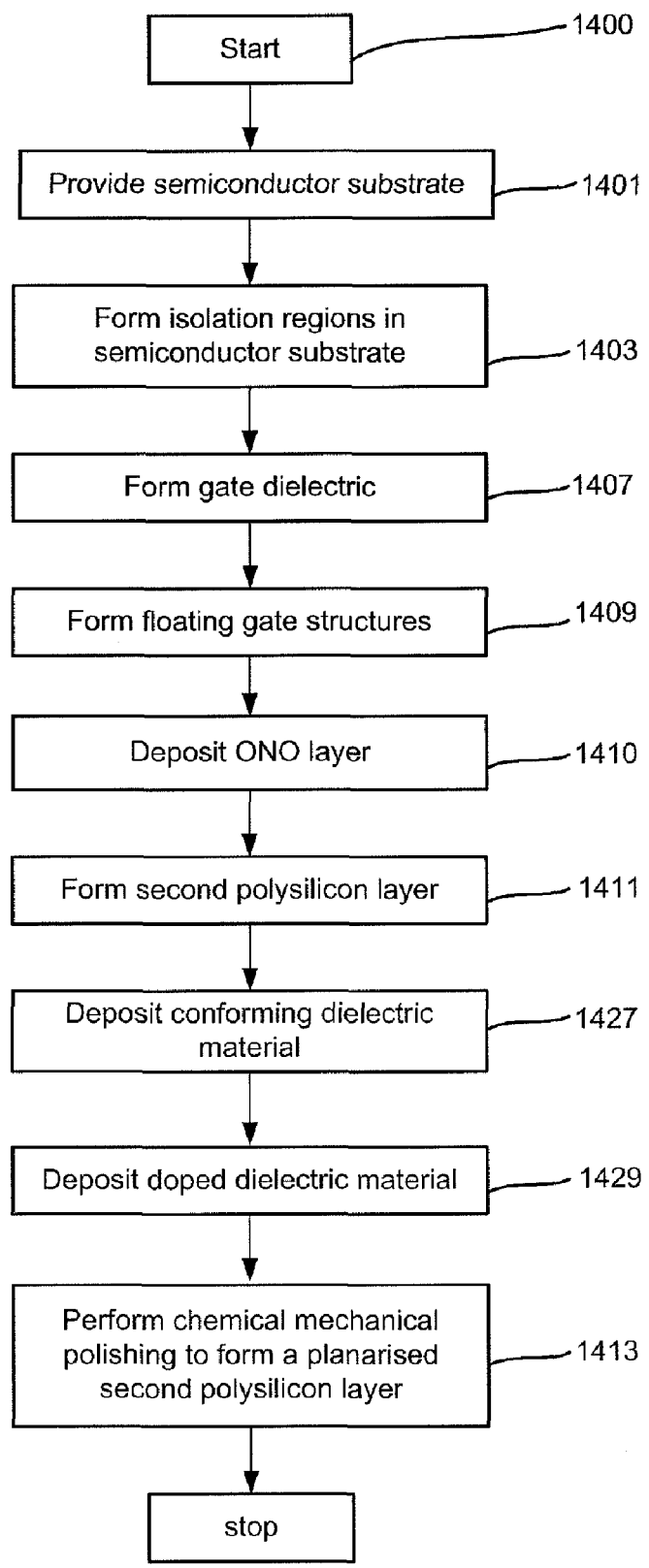
FIG. 14 is a simplified flow diagram illustrating a fourth method of forming a multi-layered gate structure according to an embodiment of the present invention.

FIG. 14 is a simplified flow diagram illustrating a fourth method of forming a multi-layered gate structure according to an embodiment of the present invention. This diagram is merely an example, which should not unduly limit the scope of the claims herein. One of ordinary skill in the art would recognize many variations, modifications, and alternatives.

Figure 15:
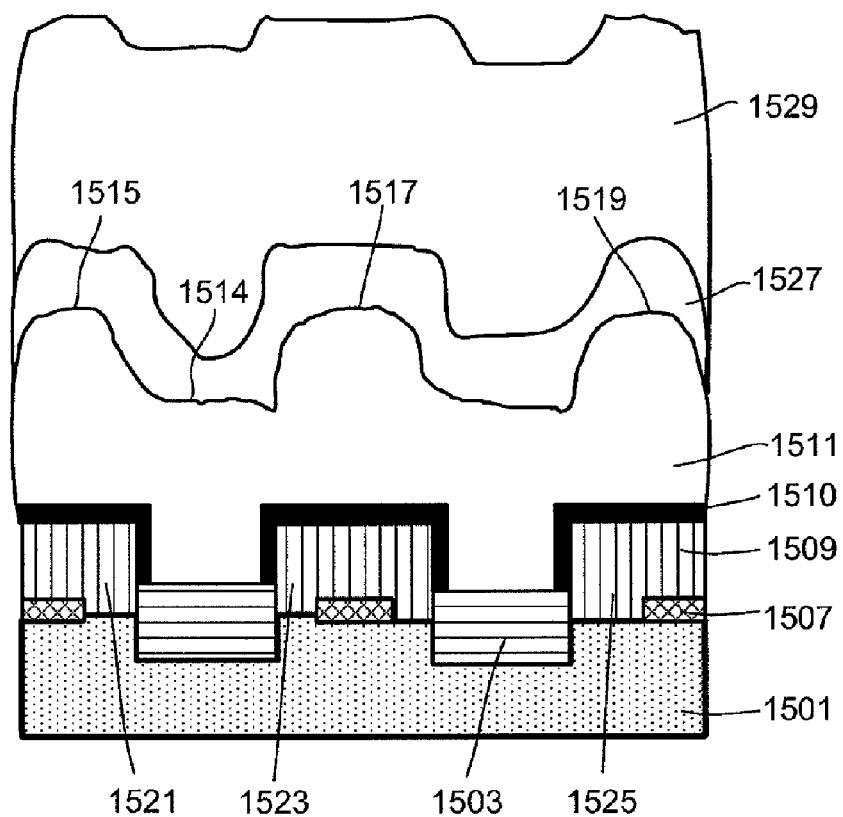
FIGS. 15 and 16 are simplified side view diagrams illustrating a fourth method of forming a multi-layered gate structure according to an embodiment of the present invention.
Figure 16:
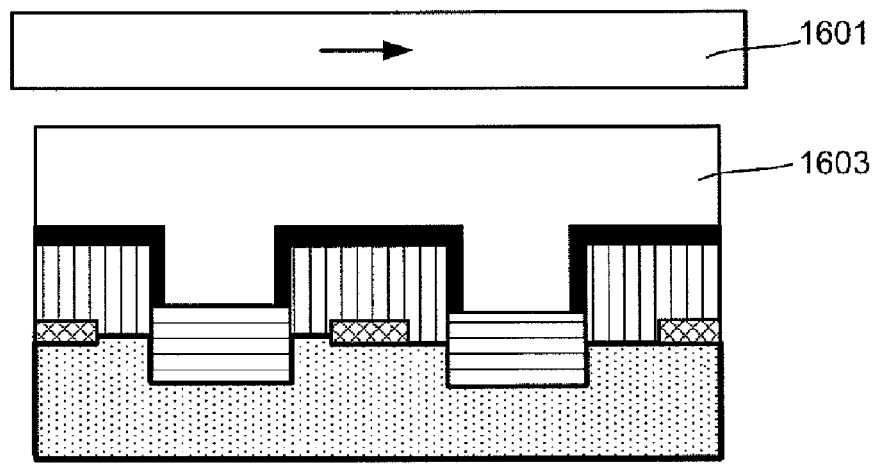

FIGS. 15 and 16 are simplified side view diagrams illustrating a fourth method of forming a multi-layered gate structure according to an embodiment of the present invention. These diagrams are merely examples, which should not unduly limit the scope of the claims herein. One of ordinary skill in the art would recognize many variations, modifications, and alternatives.

In a specific embodiment, the present invention provides a method for fabricating flash memory devices, e.g., NAND, NOR. As shown in FIGS. 14 and 15, the method begins with start, step 1400. In a specific embodiment, the method includes providing a semiconductor substrate 1401, 1501, e.g., silicon wafer, silicon on insulator, epitaxial silicon, silicon germanium. In a specific embodiment, the method forms a plurality of isolation regions 1403, 1503 on portions of the semiconductor substrate. The isolation regions can be formed using a shallow trench isolation process, commonly called STI or the like. As also shown, FIGS. 15 and 16 are simplified side view diagrams illustrating a second method of forming a multi-layered gate structure according to an embodiment of the present invention. These diagrams are merely examples, which should not unduly limit the scope of the claims herein. One of ordinary skill in the art would recognize many variations, modifications, and alternatives.

In a specific embodiment, the method forms a gate dielectric layer 1407, 1507 overlying the semiconductor substrate. The gate dielectric layer can be made of a silicon dioxide, silicon nitride, silicon oxynitride, or any combination of these materials. In a specific embodiment, the gate dielectric layer is high quality and substantially free from any imperfections, e.g., pin holes. Of course, there can be other variations, modifications, and alternatives.

Referring again to FIGS. 15 and 16, the method forms a plurality of floating gate structures 1409, 1509 from at least a first polysilicon layer overlying the semiconductor substrate. In a specific embodiment, the plurality of floating gate structures includes a first floating gate structure 1521, a second floating gate structure 1523, and a third floating gate structure 1525. In a preferred embodiment, the first floating gate structure is spaced from the second floating gate structure by at least a first isolation region. In a preferred embodiment, the second floating gate structure is spaced from the third floating gate structure by at least a second isolation region. The first isolation region and the second isolation region are from the plurality of isolation regions.

In a specific embodiment, the method forms an isolating layer 1510 overlying the floating gate structures. In a specific embodiment, the isolating layer can be an oxide-on-nitride-on-oxide layer, commonly called "ONO" layers. The oxide is silicon dioxide or other like material. The nitride is often silicon nitride or silicon oxynitride or other like material. Of course, there can be other variations, modifications, and alternatives.

In a specific embodiment, the method forms a second polysilicon layer 1411, 1511 overlying the first floating gate structure, the second floating gate structure, and the third floating gate structure. The method causes formation of an upper surface 1514 provided on the second polysilicon layer. The upper surface has a first recessed region having a first depth within a first vicinity overlying the first isolation region and has a second recessed region having a second depth within a second vicinity overlying the second isolation region. The first recessed region is between a first elevated region 1515 within a vicinity overlying the first floating gate structure and a second elevated region 1517 within a vicinity overlying the second floating gate structure. The second recessed region is between the second elevated region and a third elevated region 1519 within a vicinity overlying the third floating gate structure.

In a specific embodiment, the method includes depositing a conforming dielectric material 1427, 1527 overlying the upper surface provided on the second polysilicon layer. An example of such conforming dielectric material may be a silicon rich oxide deposited using a plasma process. Other like conforming dielectric materials may also be used depending on the application. The method includes depositing a doped dielectric material 1429, 1529 overlying the conforming dielectric material to fill the first recessed region and the second recessed region to form an upper surface region and to cover the first elevated region, the second elevated region, and the third elevated region, as shown. In a specific embodiment, the doped dielectric material can be borophosphosilicate glass deposited using a chemical vapor deposition process. In a specific embodiment the doped dielectric material can be replaced by any suitable fill material, including combinations of materials without departing from the scope of the claims herein. Other like materials may also be used depending on the application. One of ordinary skill in the art would recognize many variations, modifications, and alternatives.

Referring to FIGS. 14 and 16, the method subjects the upper surface region to a chemical mechanical polishing process 1413, 1601 to remove a first thickness of the doped dielectric material while maintaining a first portion of the doped dielectric material and the conforming dielectric material within the first recessed region and while maintaining a second portion of the doped dielectric material and the conforming dielectric material within the second recessed region to form an exposed region of the doped dielectric material while maintaining attachment of the second polysilicon layer to the first floating gate structure, second floating gate structure, and third floating gate structure. The method also includes subjecting the exposed region of the doped dielectric material to the chemical mechanical polishing process to remove the first elevated region, the second elevated region, and the third elevated region to cause formation of a substantially planarized second polysilicon layer 1603 free from the doped dielectric material and the conforming dielectric material. In a specific embodiment, the method forms a dielectric layer or layers overlying the second polysilicon layer. Of course, there can be other variations, modifications, and alternatives.

As shown, the above sequence of steps provides a method according to an embodiment of the present invention. As shown, the method uses a combination of steps including a way of forming a multi-layered gate structure for a Flash Memory Device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 17-25 are simplified diagrams illustrating experimental results according to embodiments of the present invention.

Figure 17:
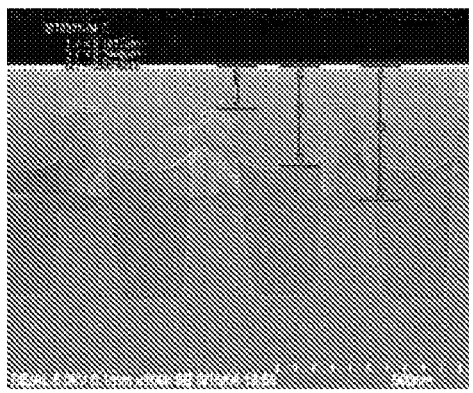
FIGS. 17-25 are simplified diagrams illustrating experimental results according to embodiments of the present invention
Figure 18:
Figure 19:
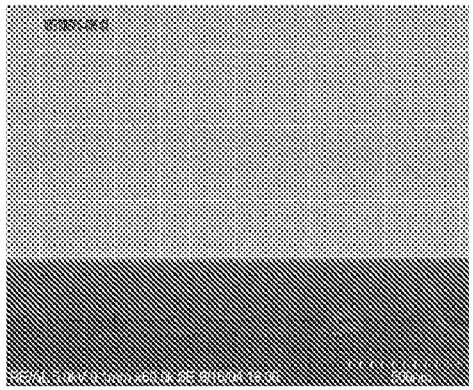
Figure 20:
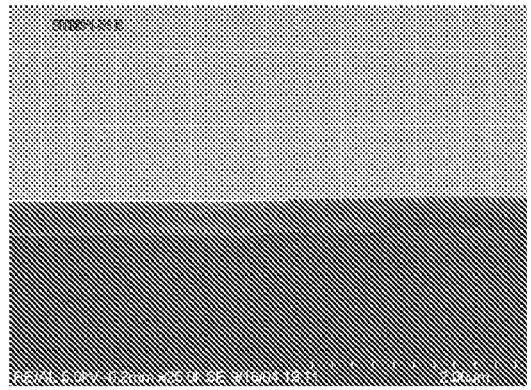

FIGS. 17-18 are a simplified cross sectional view of a scanning electron micrograph of cell gate polysilicon structures according to embodiments of present invention. FIGS. 19-20 are simplified scanning electron micrograph of peripheral gate polysilicon structures according to embodiments of present invention. As shown, the gate polysilicon structures remained intact in both cell region and peripheral region after chemical mechanical polishing process.

Figure 21:
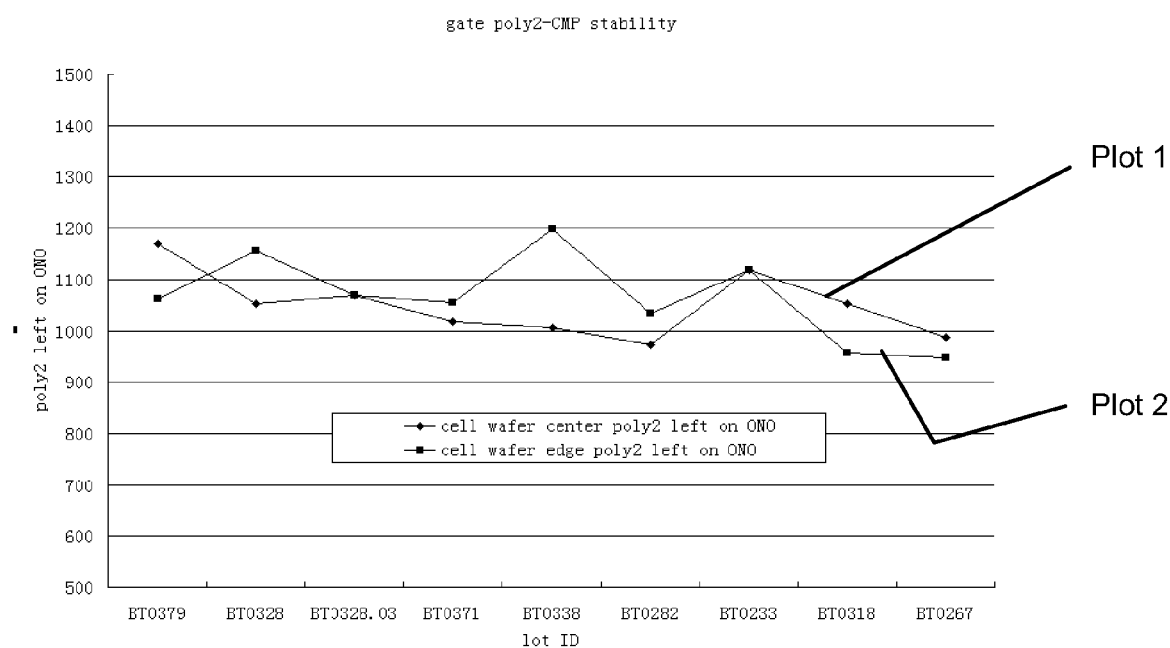

FIG. 21 is a simplified diagram illustrating results of gate polysilicon according to an embodiment of present invention. The vertical axis illustrates second polysilicon thickness and the horizontal axis illustrates lot number. As shown are plot 1, second polysilicon thickness in peripheral region and plot 2, second polysilicon thickness in cell region. The thickness repeatability of second polysilicon is within a pre-determined target.

Figure 22:
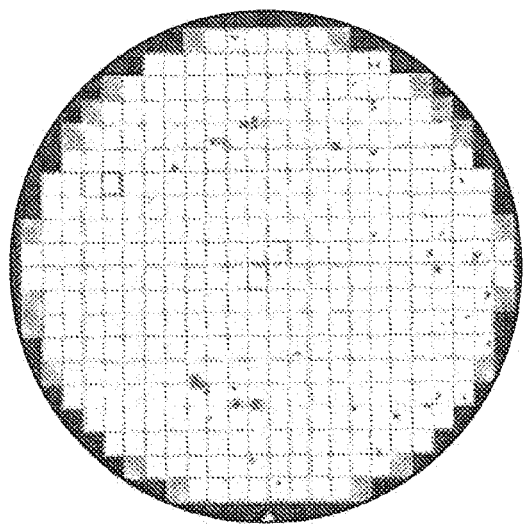
Figure 22:
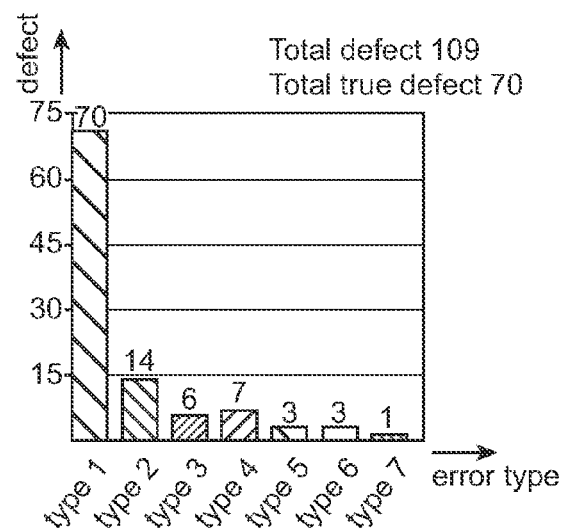
Figure 23:
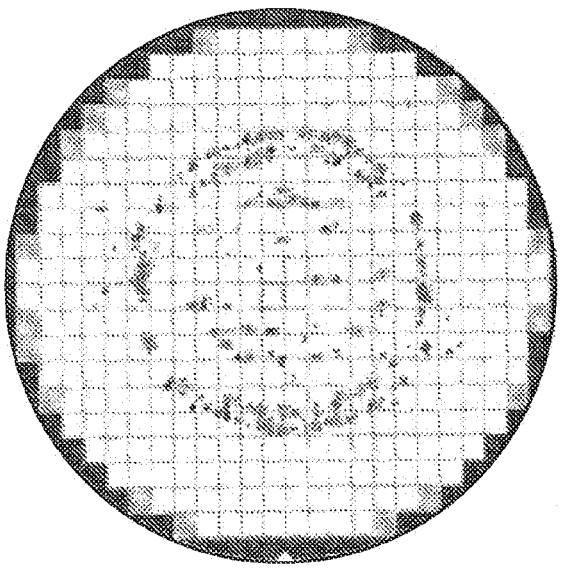
Figure 23:
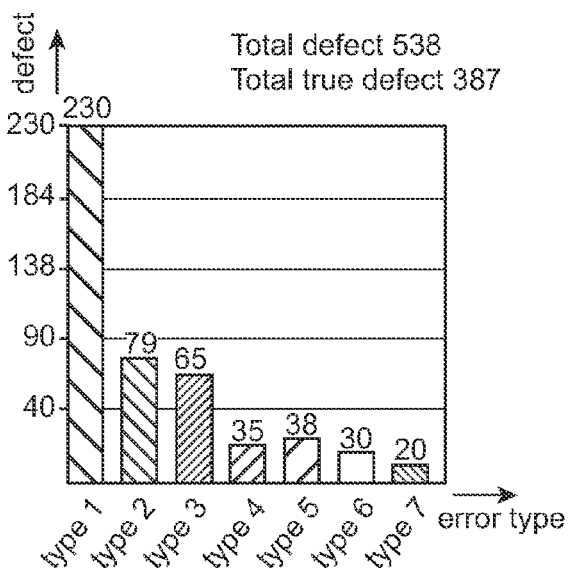
Figure 24A:
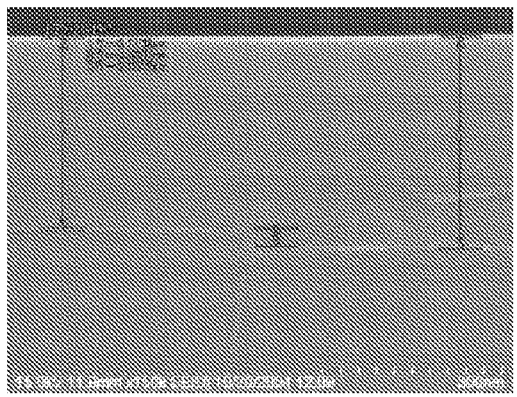
Figure 24C:
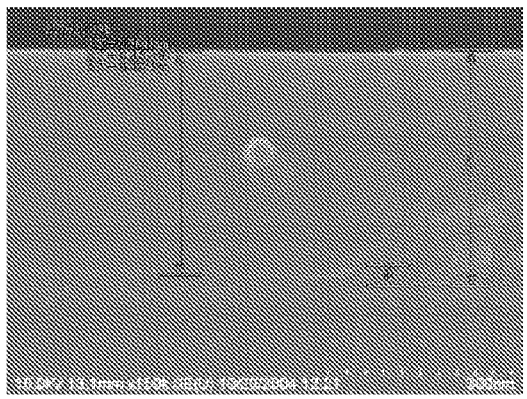
Figure 24B:
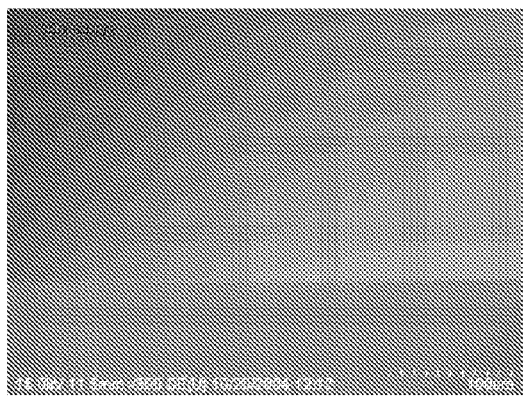
Figure 24D:

FIG. 22 is a simplified defect map on a wafer after gate polysilicon CMP according to an embodiment of present invention. FIG. 23 is a defect map on a wafer after gate polysilicon CMP using a convention method. As shown, the defect counts and defect density are higher using the conventional method for forming polysilicon gate. The gate structures from the wafer shown in FIG. 22 is examined using a scanning electron microscope (SEM). The results are shown in FIGS. 24(*a*)-(*d*). FIG. 24(*a*) and (*c*) are cross section SEM picture of polysilicon gate in peripheral region on wafer center and wafer edge respectively. FIGS. 24 (*b*) and (*d*) are top view SEM picture of polysilicon gate in peripheral region on wafer center region and wafer edge region respectively. As shown, polysilicon layer is intact and no pattern damage is observed.

Figure 25A:
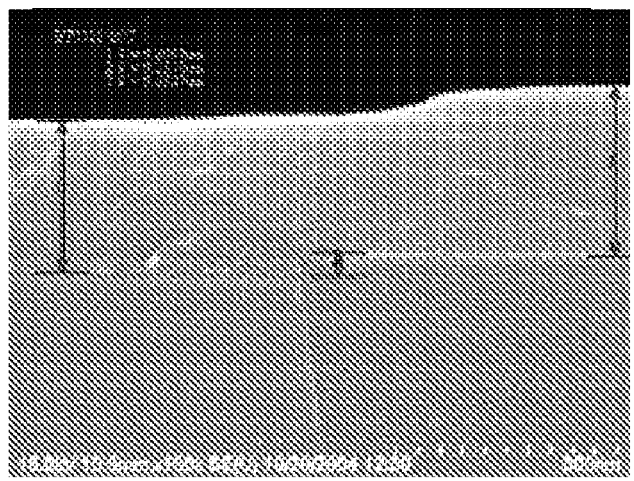
Figure 25B:
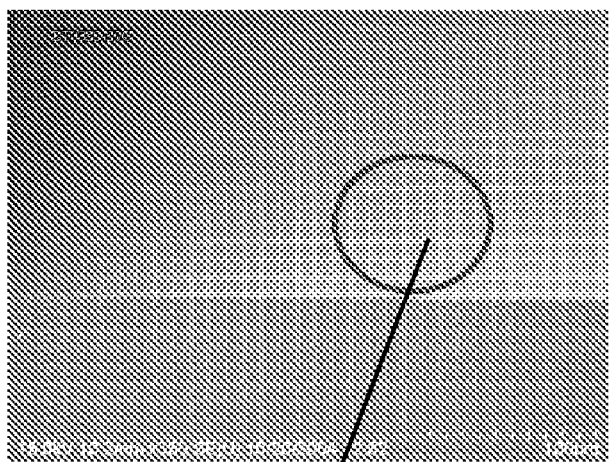
Figure 25C:
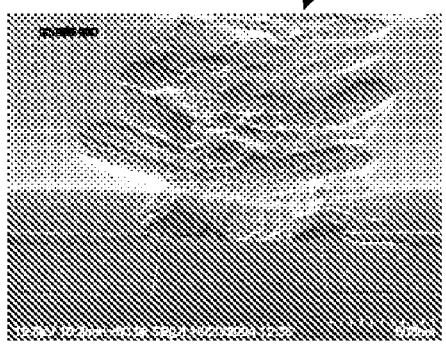

The gate structures from the wafer shown in FIG. 23 are also examined using SEM. The results are shown in FIGS. 25(*a*)-(*f*). FIG. 25(*a*), (*b*), and (*c*) are SEM pictures of peripheral polysilicon layers in wafer center region. As shown, peripheral polysilicon layer in wafer center region is detached, causing pattern damage.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating flash memory devices, the method comprising:
 providing a semiconductor substrate;
 forming a plurality of isolation regions on portions of the semiconductor substrate;
 forming a plurality of floating gate structures from at least a first polysilicon layer overlying the semiconductor substrate, the plurality of floating gate structures including a first floating gate structure, a second floating gate structure, and a third floating gate structure, the first floating gate structure being spaced from the second floating gate structure by at least a first isolation region, the second floating gate structure being spaced from the third floating gate structure by at least a second isolation region, the first isolation region and the second isolation region being from the plurality of isolation regions;
 forming a second polysilicon layer overlying the first floating gate structure, the second floating gate structure, and the third floating gate structure;

causing formation of an upper surface provided on the second polysilicon layer, the upper surface having a first recessed region having a first depth within a first vicinity overlying the first isolation region and a second recessed region having a second depth within a second vicinity overlying the second isolation region, the first recessed region being between a first elevated region within a vicinity overlying the first floating gate structure and a second elevated region within a vicinity overlying the second floating gate structure, the second recessed region being between the second elevated region and a third elevated region within a vicinity overlying the third floating gate structure; and depositing a dielectric material overlying the upper surface provided on the second polysilicon layer to fill the first recessed region and the second recessed region to form an upper surface region and cover the first elevated region, the second elevated region, and the third elevated region;

removing, using at least an etching process, a thickness of the dielectric material to form at least one dielectric spacer within the first recessed region and to form at least one dielectric spacer within the second recessed region to form a resulting surface region; and subjecting the resulting surface region to a chemical mechanical polishing process to cause formation of a substantially planarized second polysilicon layer free from the dielectric material.

2. The method of claim 1 further comprising forming an oxide on nitride on oxide layer overlying the first floating gate structure, the second floating gate structure, and the third floating gate structure.

3. The method of claim 1 wherein the first floating gate structure, the second floating gate structure, and the third floating gate structure are provided overlying a dielectric layer.

4. The method of claim 1 wherein the first isolation region and the second isolation region are provided by a high density plasma process.

5. The method of claim 1 wherein the first elevated region, the second elevated region, and the third elevated region are characterized by a height of about 500 Angstroms and greater above the first depth or the second depth.

6. The method of claim 1 wherein the at least one dielectric spacer in the first recessed region provides mechanical support between the first elevated region and the second elevated region, and the at least one dielectric spacer in the second recessed region provides mechanical support between the second elevated region and the third elevated region.

7. The method of claim 1 wherein the dielectric material comprises a TEOS material.

8. The method of claim 1 wherein the subjecting step is free from a breakage of at least the first elevated region, the second elevated region, or the third elevated region.

9. The method of claim 1 wherein the chemical mechanical polishing process comprises a first chemical mechanical polishing process and a second chemical mechanical polishing process.

10. The method of claim 1 wherein the planarized second polysilicon layer is provided for a control gate.

11. A method for fabricating flash memory devices, the method comprising:

providing a semiconductor substrate;

forming at least a first polysilicon layer including at least a first floating gate structure, a second floating gate structure, and a third floating gate structure, the first floating gate structure being spaced from the second floating gate structure by at least a first isolation region, the second floating gate structure being spaced from the third floating gate structure by at least a second isolation region;

forming a second polysilicon layer overlying the first floating gate structure, the second floating gate structure, and the third floating gate structure to cause formation of an upper surface provided on the second polysilicon layer, the upper surface having a first recessed region having a first depth within a first vicinity overlying the first isolation region and a second recessed region having a second depth within a second vicinity overlying the second isolation region, the first recessed region being between a first elevated region within a vicinity overlying the first floating gate structure and a second elevated region within a vicinity overlying the second floating gate structure, the second recessed region being between the second elevated region and a third elevated region within a vicinity overlying the third floating gate structure; and depositing a dielectric material overlying the upper surface provided on the second polysilicon layer to fill the first recessed region and the second recessed region to form an upper surface region and cover the first elevated region, the second elevated region, and the third elevated region;

removing, using at least an etching process, a thickness of the dielectric material to form at least one dielectric spacer within the first recessed region and to form at least one dielectric spacer within the second recessed region to form a resulting surface region; and subjecting the resulting surface region to a chemical mechanical polishing process to remove the first elevated region, the second elevated region, and the third elevated region to cause formation of a substantially planarized second polysilicon layer free from the photo resist material.

12. The method of claim 11 further comprising forming an oxide on nitride on oxide layer overlying the first floating gate structure, the second floating gate structure, and the third floating gate structure.

13. The method of claim 11 wherein the first floating gate structure, the second floating gate structure, and the third floating gate structure are provided overlying a dielectric layer.

14. The method of claim 11 wherein the first isolation region and the second isolation region are provided by a high density plasma process.

15. The method of claim 11 wherein the first elevated region, the second elevated region, and the third elevated region are characterized by a height of about 500 Angstroms and greater above the first depth or the second depth.

16. The method of claim 11 wherein the at least one dielectric spacer within the first recessed region provides mechanical support between the first elevated region and the second elevated region.

17. The method of claim 11 wherein the at least one dielectric spacer within the second recessed region provides mechanical support between the second elevated region and the third elevated region.

18. The method of claim 11 wherein the subjecting step is free from a breakage of at least the first elevated region, the second elevated region, or the third elevated region.

19. The method of claim 11 wherein the chemical mechanical polishing process comprises a first chemical mechanical polishing process and a second chemical mechanical polishing process.

20. The method of claim 11 wherein the planarized second polysilicon layer is provided for a control gate.

21. A method for fabricating flash memory devices, the method comprising:

providing a semiconductor substrate;

forming a plurality of isolation regions on portions of the semiconductor substrate;

forming a plurality of floating gate structures from at least a first polysilicon layer overlying the semiconductor substrate, the plurality of floating gate structures including a first floating gate structure, a second floating gate structure, and a third floating gate structure, the first floating gate structure being spaced from the second floating gate structure by at least a first isolation region, the second floating gate structure being spaced from the third floating gate structure by at least a second isolation region, the first isolation region and the second isolation region being from the plurality of isolation regions;

forming a second polysilicon layer overlying the first floating gate structure, the second floating gate structure, and the third floating gate structure;

causing formation of an upper surface provided on the second polysilicon layer, the upper surface having a first recessed region having a first depth within a first vicinity overlying the first isolation region and a second recessed region having a second depth within a second vicinity overlying the second isolation region, the first recessed region being between a first elevated region within a vicinity overlying the first floating gate structure and a second elevated region within a vicinity overlying the second floating gate structure, the second recessed region being between the second elevated region and a third elevated region within a vicinity overlying the third floating gate structure;

depositing a fill material overlying the upper surface provided on the second polysilicon layer to fill the first recessed region and the second recessed region to form an upper surface region and cover the first elevated region, the second elevated region, and the third elevated region;

subjecting the upper surface region to a chemical mechanical polishing process to remove a first thickness of the fill material while maintaining a first portion of the fill material within the first recessed region and while maintaining a second portion of the fill material within the second recessed region to form an exposed region of the fill material while maintaining attachment of the second polysilicon layer to the first floating gate structure, second floating gate structure, and third floating gate structure; and subjecting the exposed region of the fill material to the chemical mechanical polishing process to remove the first elevated region, the second elevated region, and the third elevated region to cause formation of a substantially planarized second polysilicon layer free from the fill material.

22. The method of claim 21 further comprising forming an oxide on nitride on oxide layer overlying the first floating gate structure, the second floating gate structure, and the third floating gate structure.

23. The method of claim 21 wherein the fill material is a photo resist material.

24. The method of claim 21 wherein the fill material is a dielectric material.

25. The method of claim 21 wherein the first floating gate structure, the second floating gate structure, and the third floating gate structure are provided overlying a dielectric layer.

26. The method of claim 21 wherein the first isolation region and the second isolation region are provided by a high density plasma process.

27. The method of claim 21 wherein the first elevated region, the second elevated region, and the third elevated region are characterized by a height of about 500 Angstroms and greater above the first depth or the second depth.

28. The method of claim 21 wherein the first portion of fill material provides mechanical support between the first elevated region and the second elevated region.

29. The method of claim 21 wherein the second portion of the fill material provides mechanical support between the second elevated region and the third elevated region.

30. The method of claim 21 wherein the subjecting the exposed region step is free from a breakage of at least the first elevated region, the second elevated region, or the third elevated region.

31. The method of claim 21 wherein the chemical mechanical polishing process comprises a first chemical mechanical polishing process and a second chemical mechanical polishing process.

32. The method of claim 21 wherein the planarized second polysilicon layer is provided for a control gate.

33. A method for fabricating flash memory devices, the method comprising:

providing a semiconductor substrate;

forming at least a first polysilicon layer including at least a first floating gate structure, a second floating gate structure, and a third floating gate structure, the first floating gate structure being spaced from the second floating gate structure by at least a first isolation region, the second floating gate structure being spaced from the third floating gate structure by at least a second isolation region;

forming a second polysilicon layer overlying the first floating gate structure, the second floating gate structure, and the third floating gate structure to cause formation of an upper surface provided on the second polysilicon layer, the upper surface having a first recessed region having a first depth within a first vicinity overlying the first isolation region and a second recessed region having a second depth within a second vicinity overlying the second isolation region, the first recessed region being between a first elevated region within a vicinity overlying the first floating gate structure and a second elevated region within a vicinity overlying the second floating gate structure, the second recessed region being between the second elevated region and a third elevated region within a vicinity overlying the third floating gate structure;

depositing a fill material overlying the upper surface provided on the second polysilicon layer to fill the first recessed region and the second recessed region to form an upper surface region and cover the first elevated region, the second elevated region, and the third elevated region;

subjecting the upper surface region to a chemical mechanical polishing process to remove a first thickness of the fill material while maintaining a first portion of the photo resist material within the first recessed region and while maintaining a second portion of the photo resist material within the second recessed region to form an exposed region of the fill material while maintaining attachment of the second polysilicon layer to the first floating gate structure, second floating gate structure, and third floating gate structure; and subjecting the exposed region to a chemical mechanical polishing process to remove the first elevated region, the second elevated region, and the third elevated region to cause formation of a substantially planarized second polysilicon layer free from the fill material.

34. The method of claim 33 wherein the fill material is a photo resist material.

35. The method of claim 33 wherein the fill material is a dielectric material.

36. The method of claim 33 further comprising forming an oxide on nitride on oxide layer overlying the first floating gate structure, the second floating gate structure, and the third floating gate structure.

37. The method of claim 33 wherein the first floating gate structure, the second floating gate structure, and the third floating gate structure are provided overlying a dielectric layer.

38. The method of claim 33 wherein the first isolation region and the second isolation region are provided by a high density plasma process.

39. The method of claim 33 wherein the first elevated region, the second elevated region, and the third elevated region are characterized by a height of about 500 Angstroms and greater above the first depth or the second depth.

40. The method of claim 33 wherein the first portion of fill material provides mechanical support between the first elevated region and the second elevated region.

41. The method of claim 33 wherein the second portion of the fill material provides mechanical support between the second elevated region and the third elevated region.

42. The method of claim 33 wherein the subjecting the exposed region step is free from a breakage of at least the first elevated region, the second elevated region, or the third elevated region.

43. The method of claim 33 wherein the chemical mechanical polishing process comprises a first chemical mechanical polishing process and a second chemical mechanical polishing process.

44. The method of claim 33 wherein the planarized second polysilicon layer is provided for a control gate.

* * * * *